(12) United States Patent
Chang et al.

(10) Patent No.: US 12,100,698 B2
(45) Date of Patent: Sep. 24, 2024

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chih-Chieh Chang, Hsinchu (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 337 days.

(21) Appl. No.: 17/407,142

(22) Filed: Aug. 19, 2021

(65) Prior Publication Data

US 2023/0057702 A1    Feb. 23, 2023

(51) Int. Cl.
*H01L 25/16* (2023.01)
*G02B 6/42* (2006.01)
(Continued)

(52) U.S. Cl.
CPC .......... *H01L 25/167* (2013.01); *H01L 23/481* (2013.01); *H01L 24/08* (2013.01);
(Continued)

(58) Field of Classification Search
CPC ... H01L 21/76877; H01L 23/48; H01L 24/11; H01L 24/19; H01L 24/20;
(Continued)

(56) References Cited

U.S. PATENT DOCUMENTS 6,343,171 B1 * 1/2002 Yoshimura .......... H01L 23/5389
385/24
6,623,178 B1 * 9/2003 Sakurai ................ G02B 6/4232
385/94

(Continued)

*Primary Examiner* — Mary A Wilczewski
*Assistant Examiner* — Tsz K Chiu
(74) *Attorney, Agent, or Firm* — JCIPRNET

(57) ABSTRACT

Semiconductor device includes light-emitting die and semiconductor package. Light emitting die includes substrate and first conductive pad. Substrate has emission region located at side surface. First conductive pad is located at bottom surface of substrate. Semiconductor package includes semiconductor-on-insulator substrate, interconnection structure, second conductive pad, and through semiconductor via. Semiconductor-on-insulator substrate has linear waveguide formed therein. Interconnection structure is disposed on semiconductor-on-insulator substrate. Edge coupler is embedded within interconnection structure and is connected to linear waveguide. Semiconductor-on-insulator substrate and interconnection structure include recess in which light-emitting die is disposed. Edge coupler is located close to sidewall of recess. Second conductive pad is located at bottom of recess. Through semiconductor via extends across semiconductor-on-insulator substrate to contact second conductive pad. First conductive pad is connected to through semiconductor via. Emission region directly faces sidewall of recess where edge coupler is located.

20 Claims, 27 Drawing Sheets

(51) Int. Cl.
*H01L 23/00* (2006.01)
*H01L 23/48* (2006.01)
*H01L 33/58* (2010.01)
*H01L 33/62* (2010.01)

(52) U.S. Cl.
CPC .............. *H01L 24/73* (2013.01); *H01L 33/58* (2013.01); *H01L 33/62* (2013.01); *H01L 2224/08145* (2013.01); *H01L 2224/73204* (2013.01)

(58) Field of Classification Search
CPC . H01L 2224/12105; H01L 2224/13016; H01L 2224/16146; H01L 2224/16227; H01L 2224/18; H01L 2224/81191; H01L 2224/16235; H01L 25/167; H01L 2924/12042; H01L 2924/12043; H01L 2924/141; H01L 2924/1426; H01L 2924/19105
See application file for complete search history.

(56) References Cited

U.S. PATENT DOCUMENTS

| | | | |
|---|---|---|---|
| 7,070,207 B2 * | 7/2006 | Asai | G02B 6/12002 |
| | | | 257/113 |
| 7,437,030 B2 * | 10/2008 | Asai | G02B 6/4204 |
| | | | 257/E31.127 |
| 8,993,380 B2 | 3/2015 | Hou et al. | |
| 9,036,952 B2 * | 5/2015 | La Porta | H05K 13/00 |
| | | | 385/2 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,651,751 B1 * | 5/2017 | Ding | G02B 6/4232 |
| 9,666,502 B2 | 5/2017 | Chen et al. | |
| 9,735,131 B2 | 8/2017 | Su et al. | |
| 9,881,904 B2 * | 1/2018 | Das | H01L 25/0657 |
| 10,001,611 B2 * | 6/2018 | Ding | H01L 23/48 |
| 10,224,286 B1 * | 3/2019 | England | H01L 25/167 |
| 10,438,894 B1 * | 10/2019 | Farooq | H01L 23/5384 |
| 10,566,287 B1 * | 2/2020 | Ding | H01L 24/17 |
| 10,746,923 B2 * | 8/2020 | Yu | G02B 6/12004 |
| 11,487,060 B2 * | 11/2022 | Liao | G02B 6/136 |
| 11,614,592 B2 * | 3/2023 | Weng | G02B 6/4253 |
| | | | 385/14 |
| 11,852,868 B2 * | 12/2023 | Yu | G02B 6/12004 |
| 2009/0028491 A1 * | 1/2009 | Fillion | H01L 23/49811 |
| | | | 385/14 |
| 2010/0109114 A1 * | 5/2010 | Izumi | H01L 21/743 |
| | | | 257/434 |
| 2010/0181601 A1 * | 7/2010 | Tabatabaie | H01S 5/183 |
| | | | 257/E29.166 |
| 2010/0232744 A1 * | 9/2010 | Asai | G02B 6/43 |
| | | | 385/14 |
| 2011/0085760 A1 * | 4/2011 | Han | G02B 6/423 |
| | | | 385/14 |
| 2011/0235965 A1 * | 9/2011 | Ueno | H01L 25/167 |
| | | | 385/14 |
| 2013/0330033 A1 * | 12/2013 | Yu | H01S 5/0233 |
| | | | 257/E33.072 |
| 2014/0056554 A1 * | 2/2014 | Brunner | G02B 6/1221 |
| | | | 65/378 |
| 2014/0203175 A1 * | 7/2014 | Kobrinsky | H04B 10/25 |
| | | | 250/214.1 |
| 2015/0295098 A1 * | 10/2015 | Toda | G02B 6/43 |
| | | | 257/82 |
| 2016/0111407 A1 * | 4/2016 | Krasulick | H01L 21/8258 |
| | | | 438/107 |
| 2017/0131469 A1 * | 5/2017 | Kobrinsky | G02B 6/12 |
| 2018/0180808 A1 * | 6/2018 | Zhang | G02B 6/4274 |
| 2018/0275359 A1 * | 9/2018 | Ding | H01L 24/81 |
| 2019/0146166 A1 * | 5/2019 | Wang | G02B 6/428 |
| | | | 385/14 |
| 2020/0006088 A1 * | 1/2020 | Yu | H01L 23/5386 |
| 2020/0091608 A1 * | 3/2020 | Alpman | H01Q 1/2283 |
| 2020/0310052 A1 * | 10/2020 | Lim | H01L 21/56 |
| 2021/0066269 A1 * | 3/2021 | Yang | H01L 23/49822 |
| 2021/0091056 A1 * | 3/2021 | Yu | H01L 31/02325 |
| 2021/0096310 A1 * | 4/2021 | Chang | H01L 21/565 |
| 2021/0120680 A1 * | 4/2021 | Pun | H05K 1/0274 |
| 2021/0273133 A1 * | 9/2021 | Chen | H01L 24/81 |
| 2022/0120684 A1 * | 4/2022 | Emadi | H01L 27/14625 |
| 2022/0283360 A1 * | 9/2022 | Nagarajan | G02B 6/43 |

* cited by examiner

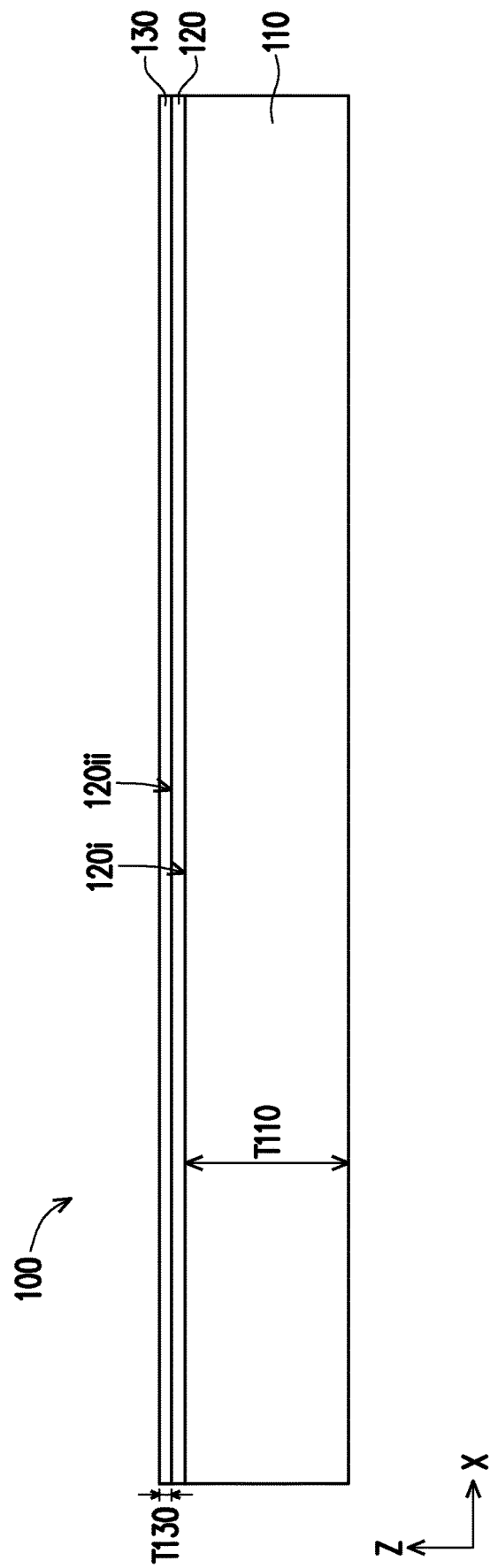

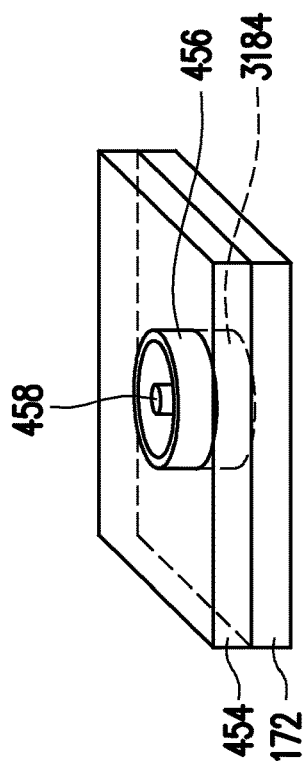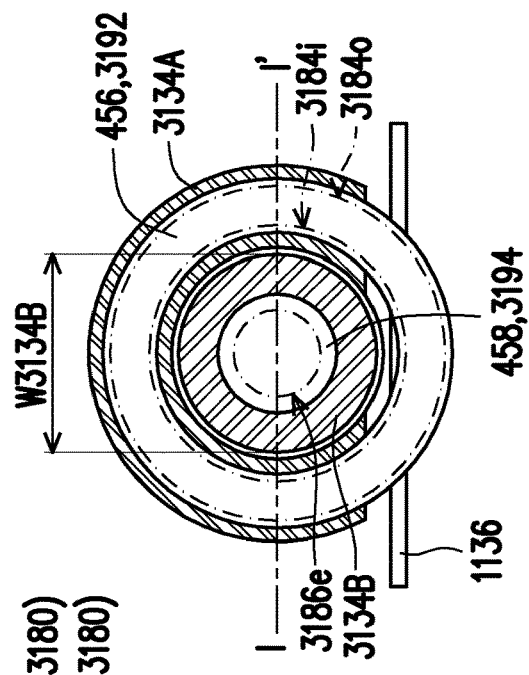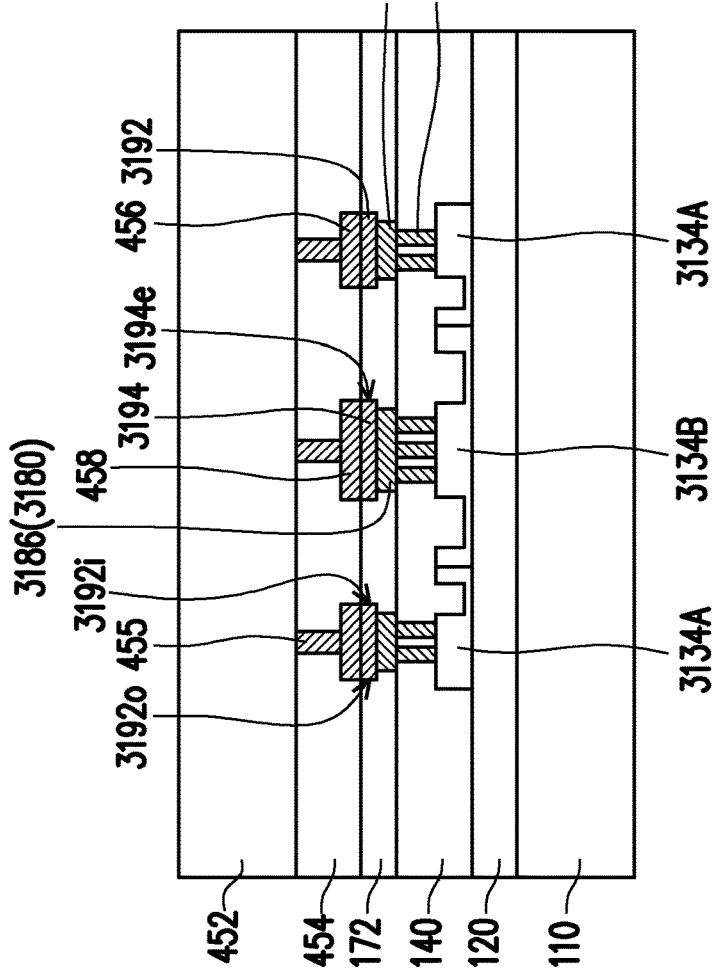

SEMICONDUCTOR DEVICE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
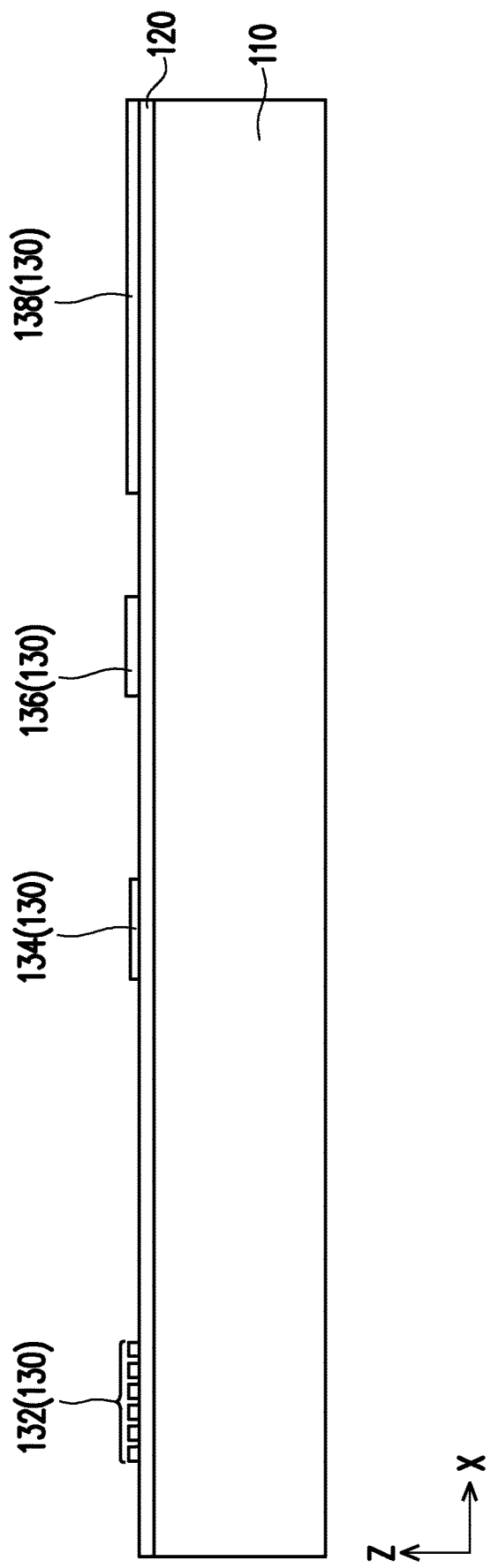
FIG. 1A to FIG. 1Q are schematic cross-sectional views illustrating structures formed during a manufacturing process of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1C:
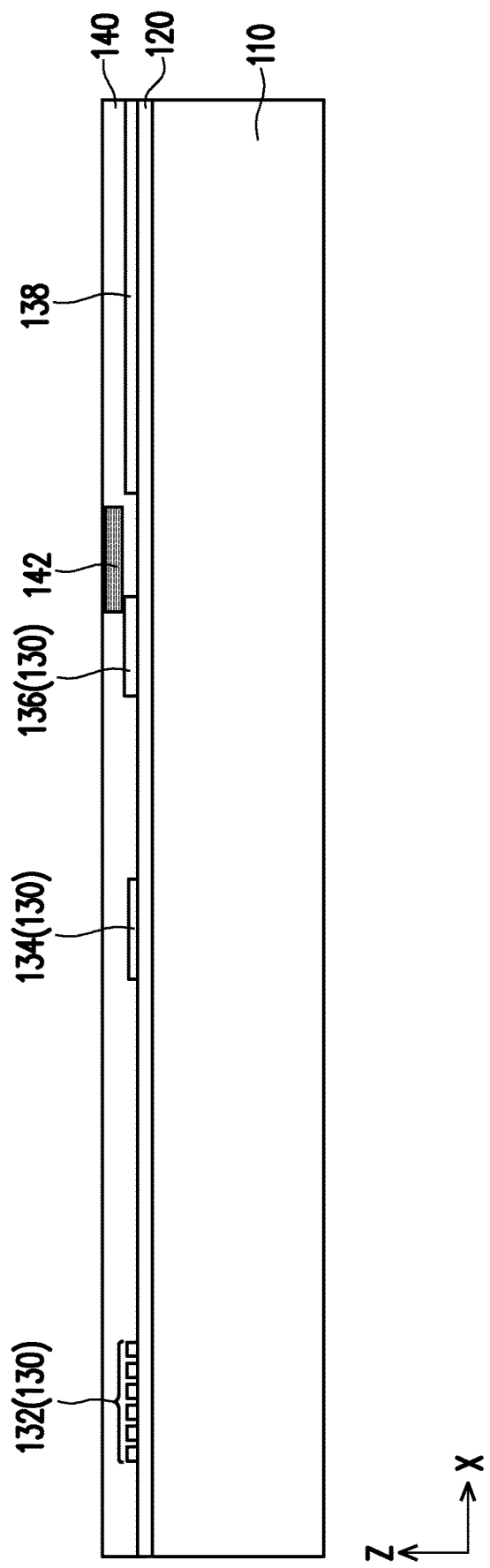
Figure 1D:
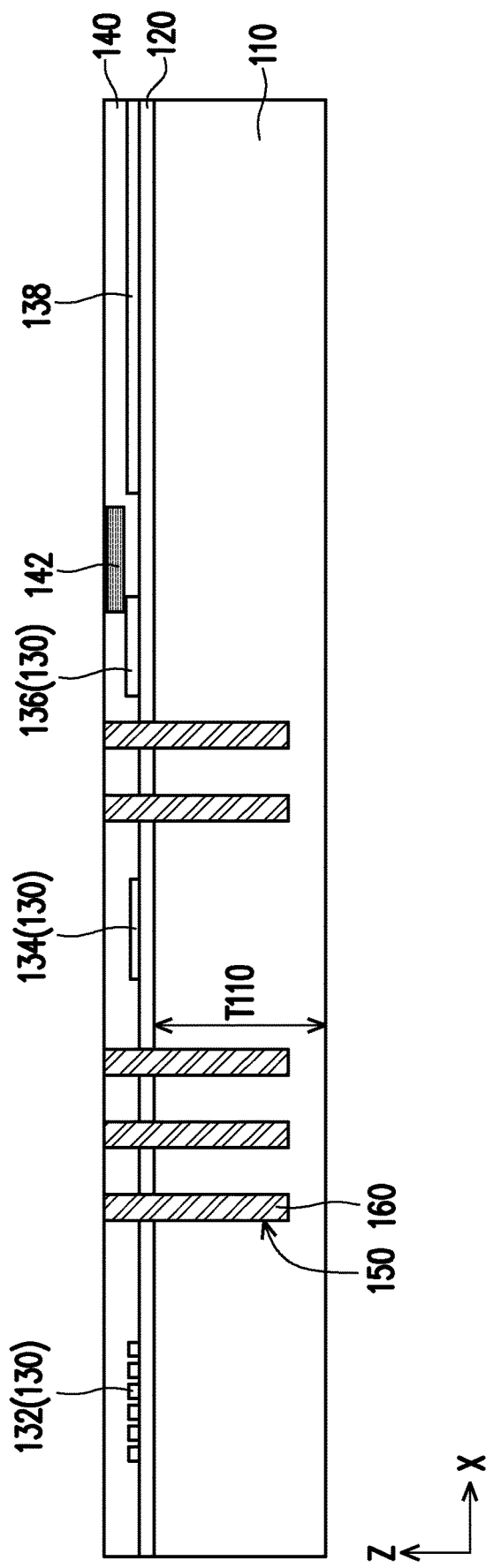
Figure 1E:
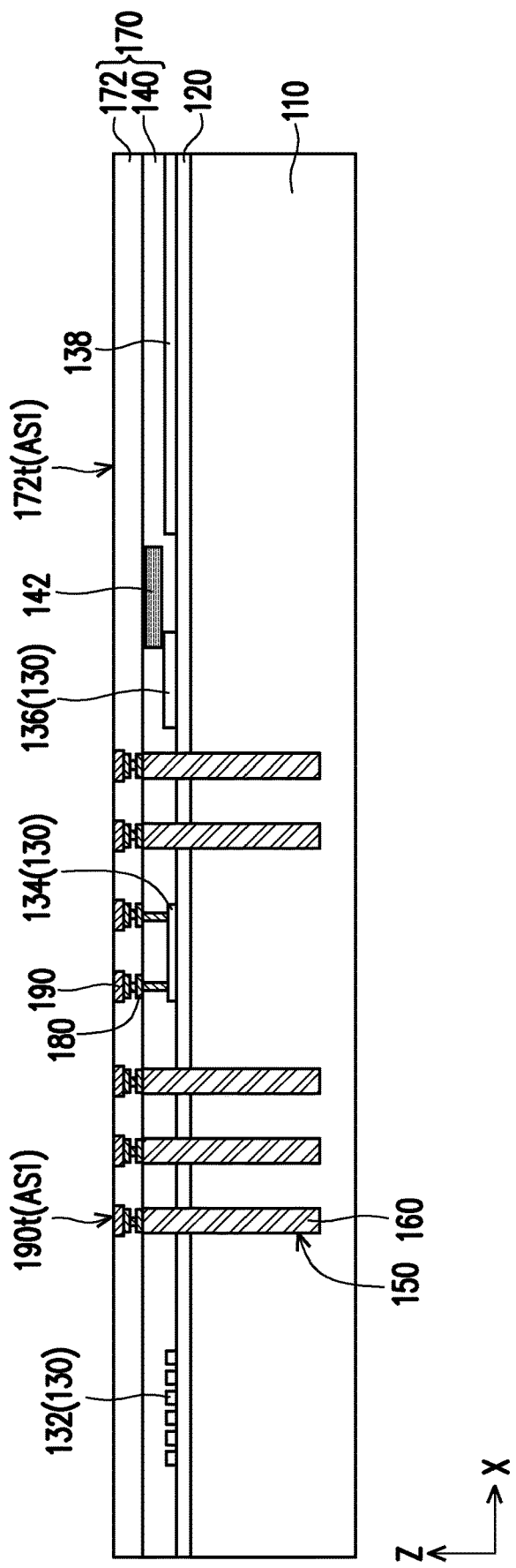
Figure 1F:
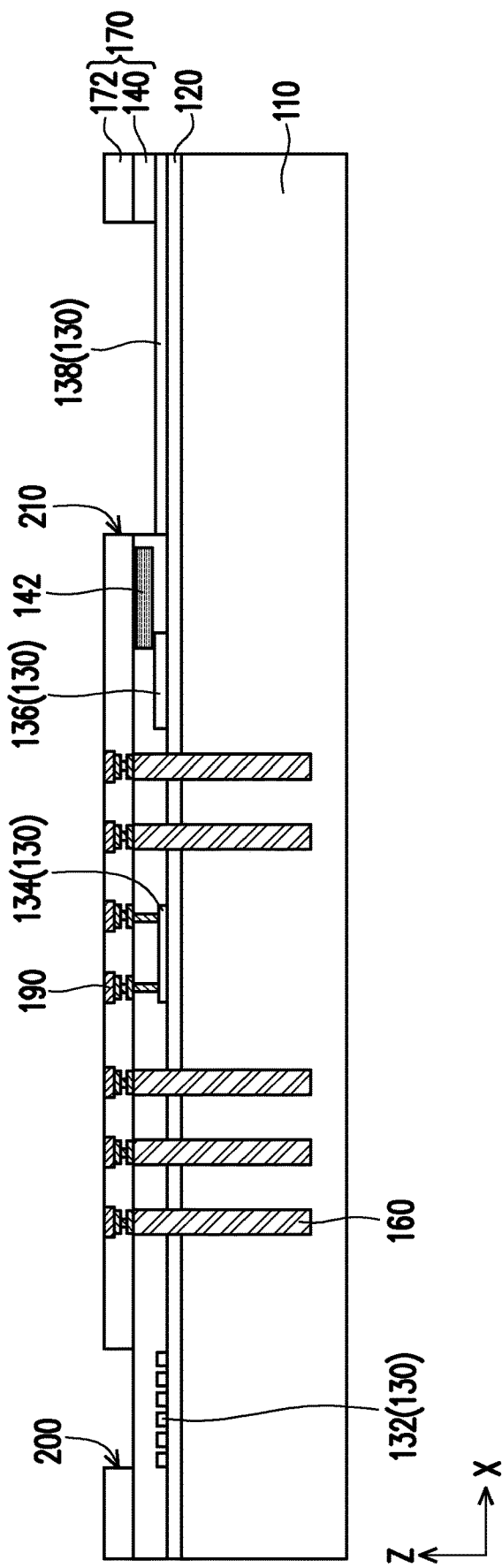
Figure 1G:
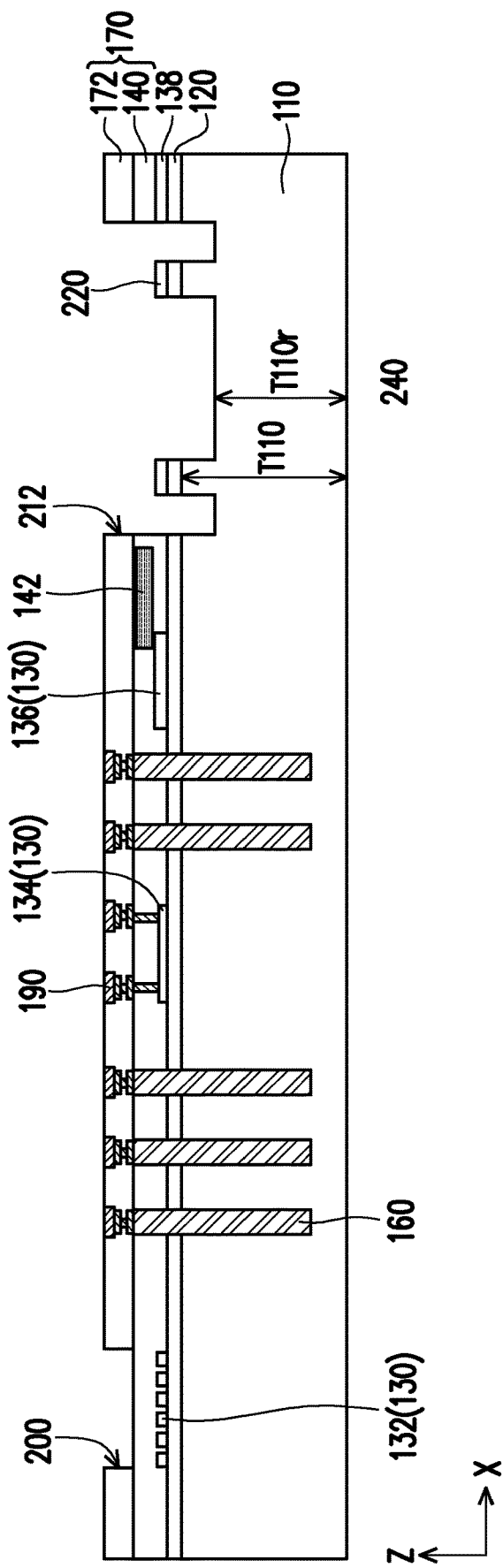
Figure 1H:
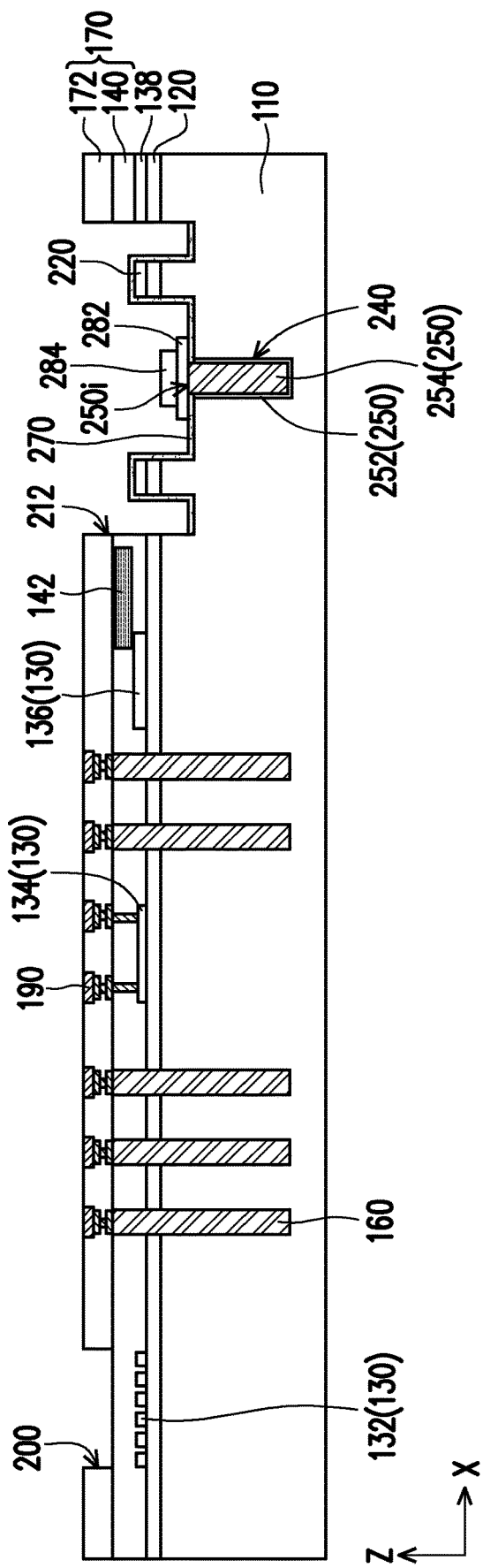
Figure 1I:
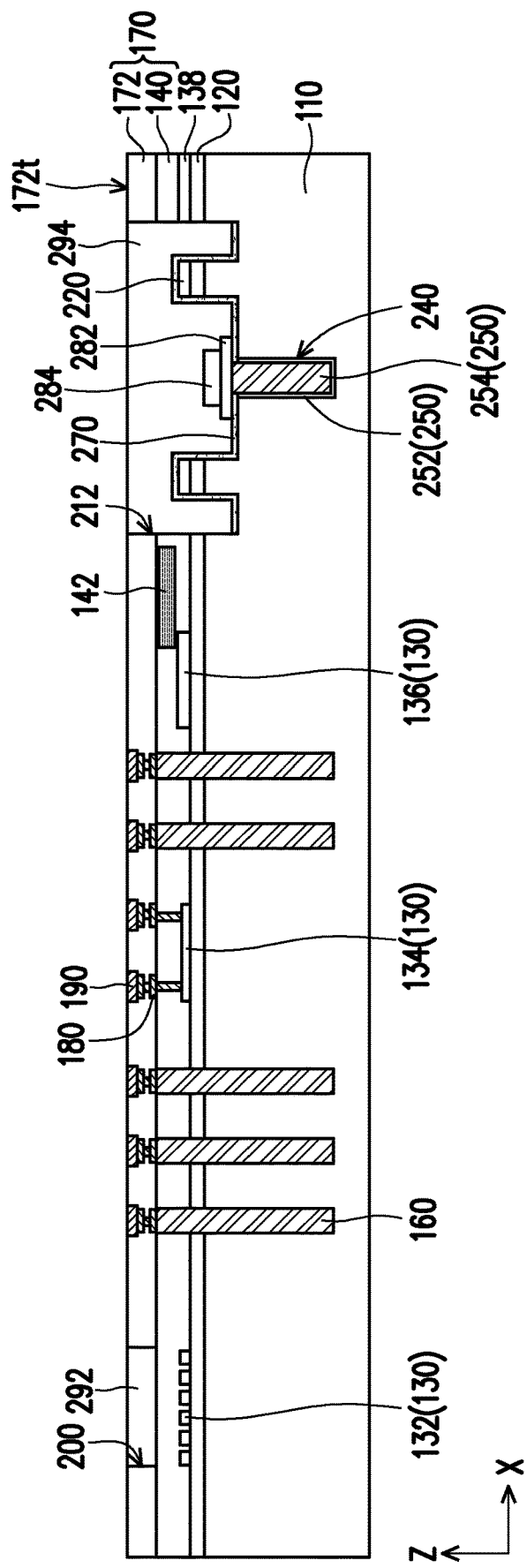
Figure 1J:
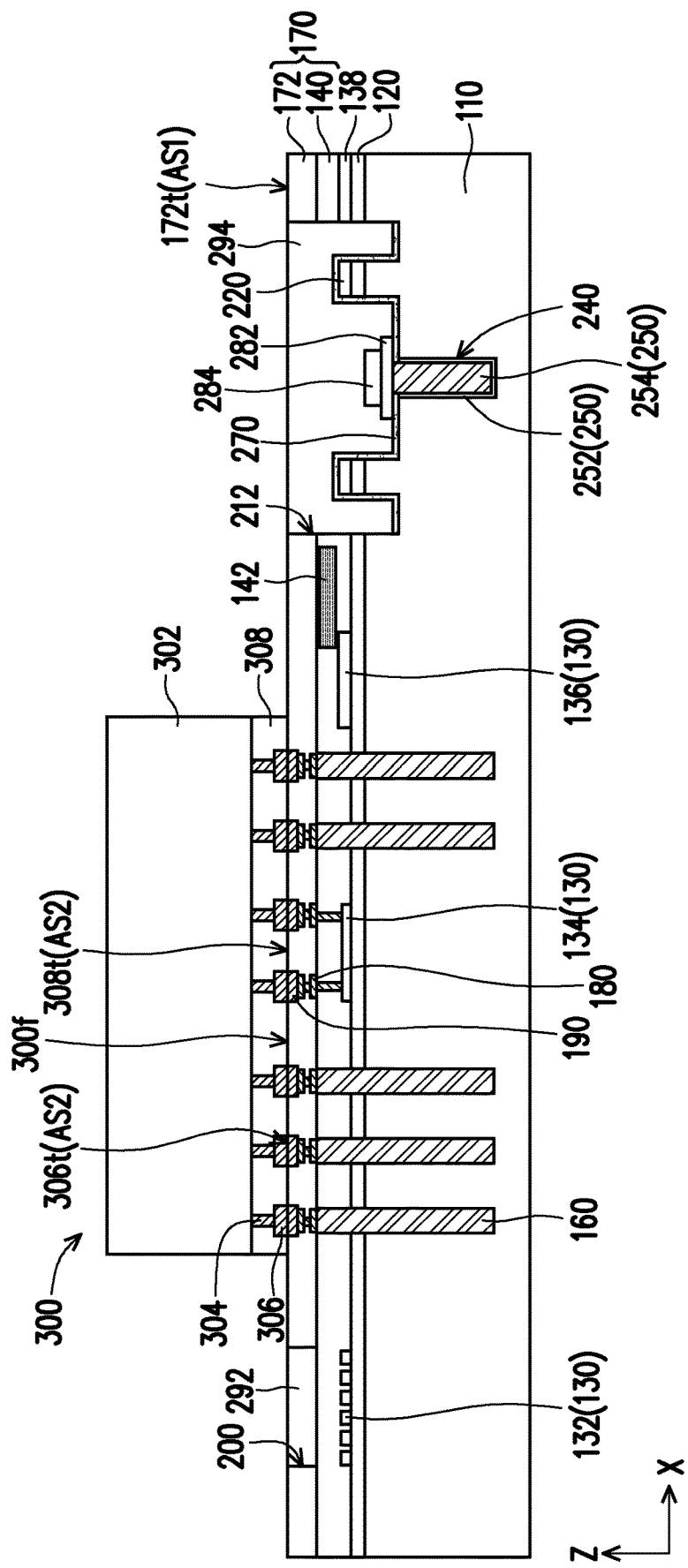
Figure 1K:
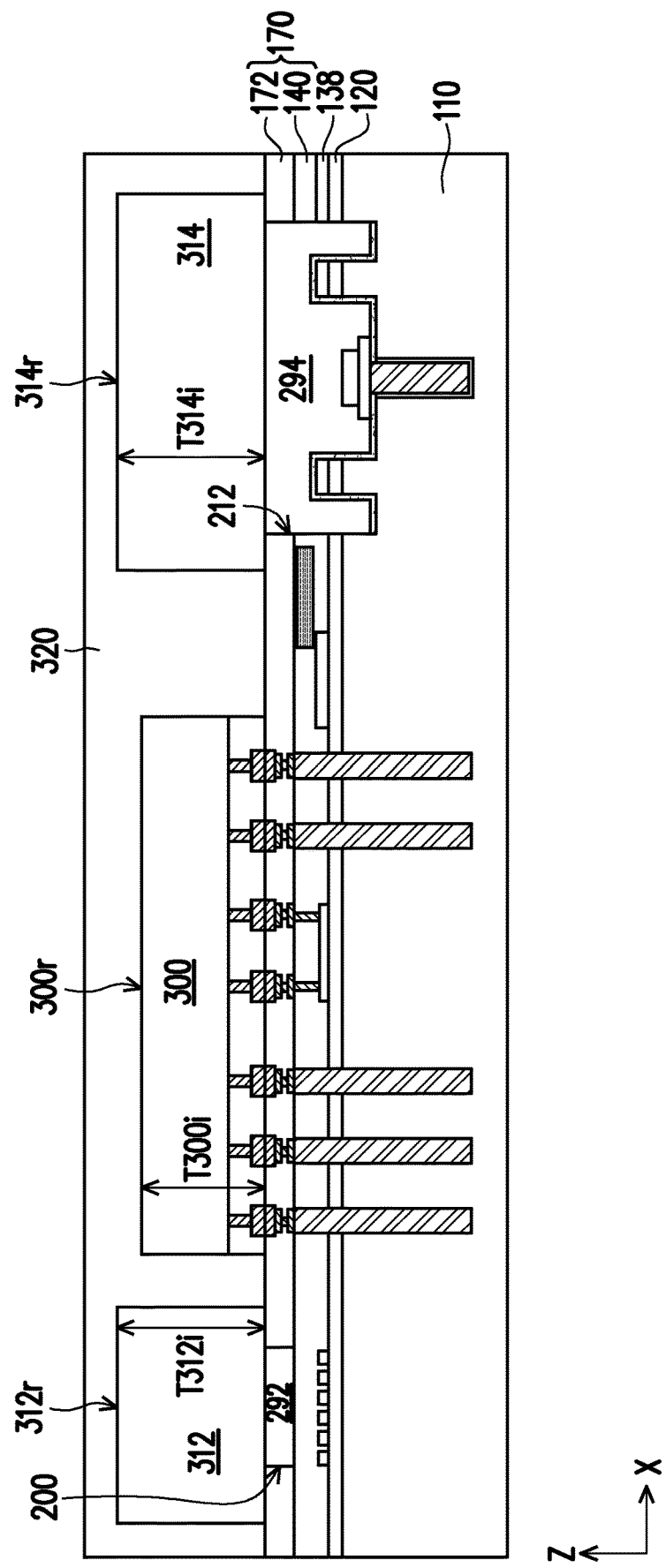
Figure 1L:
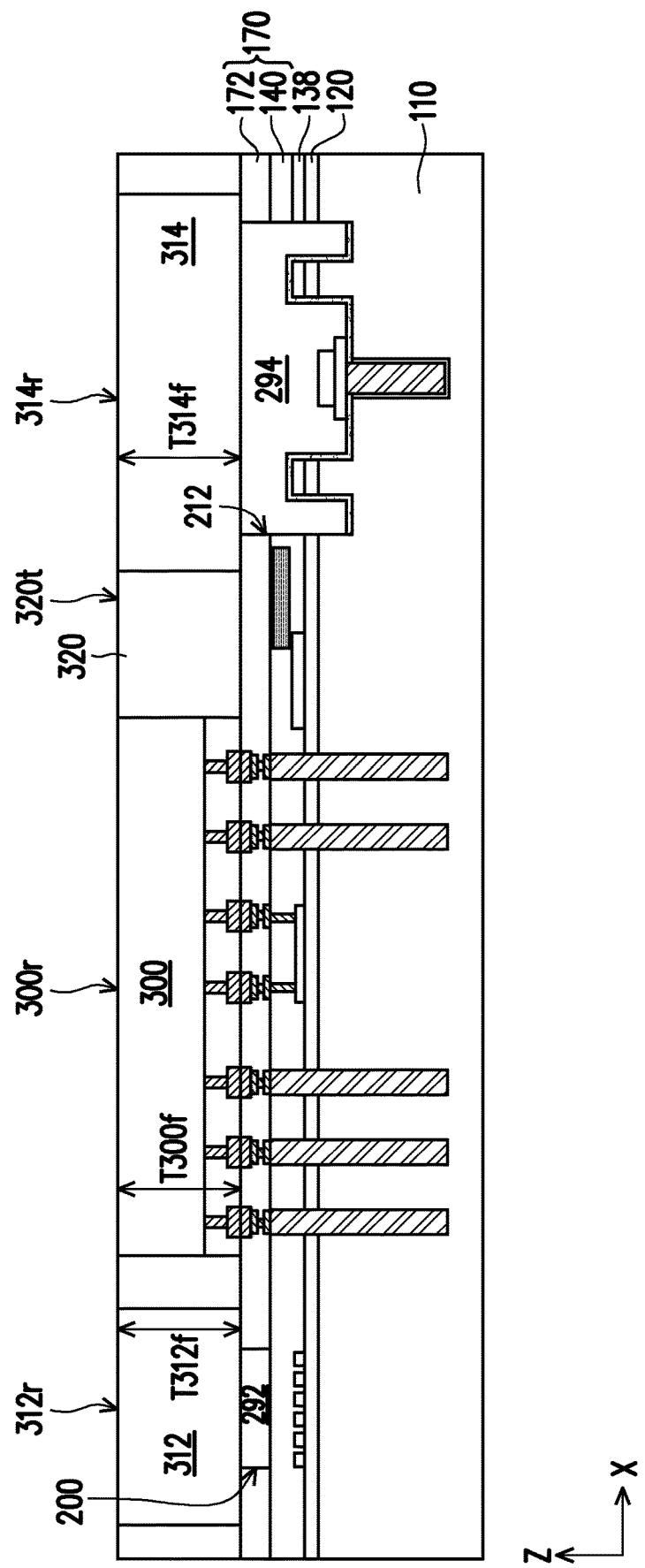
Figure 1M:
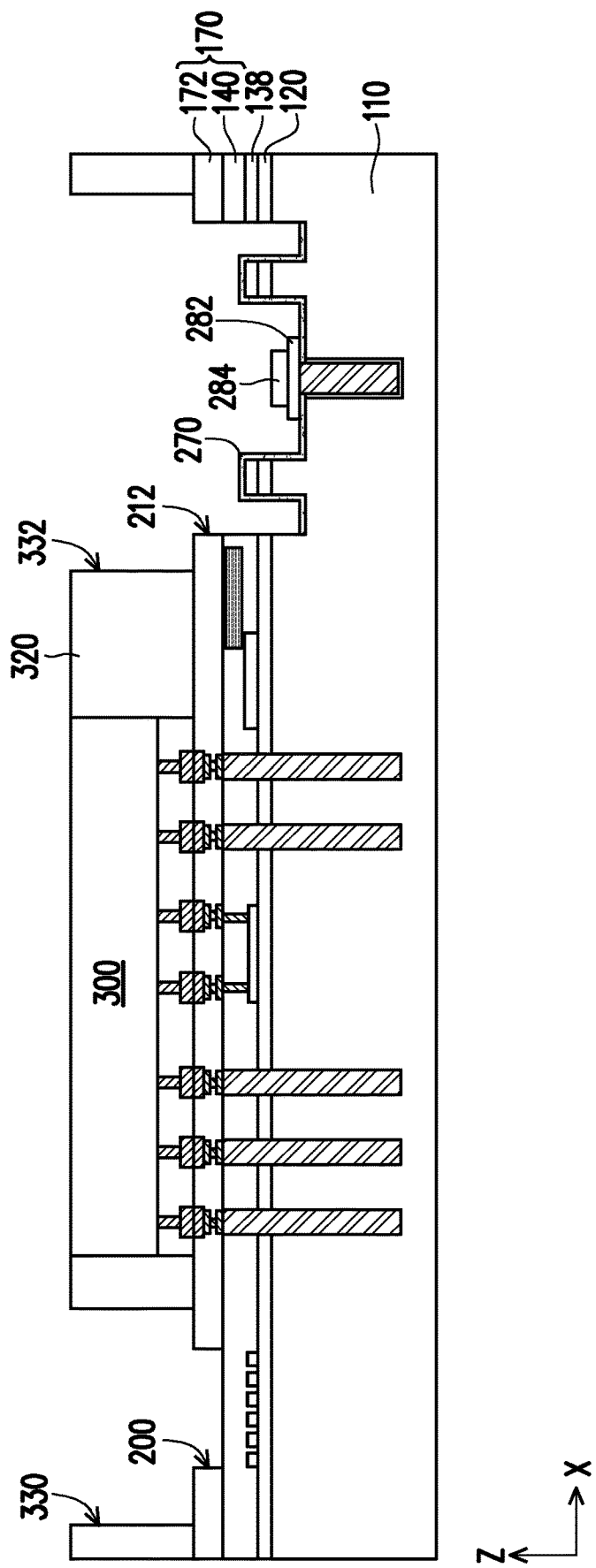
Figure 1N:
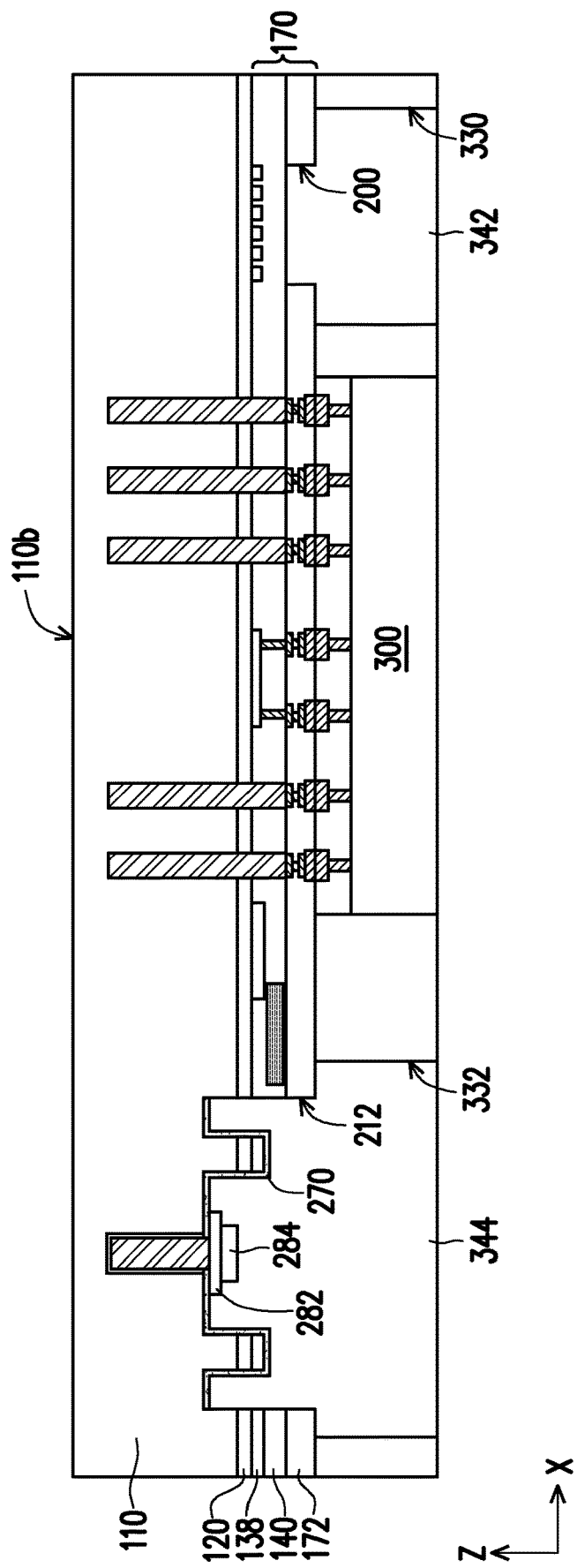
Figure 1P:
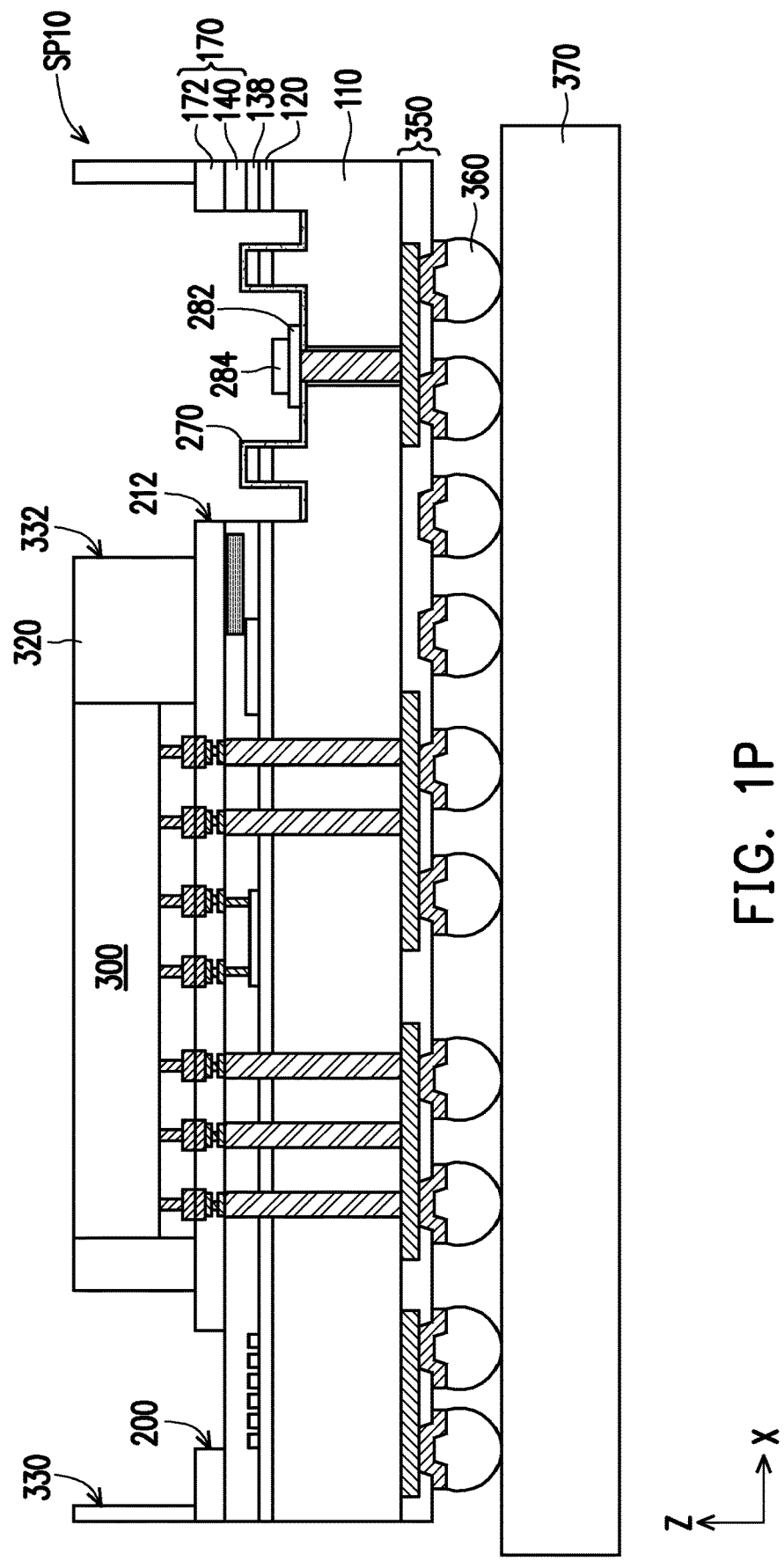
Figure 1Q:
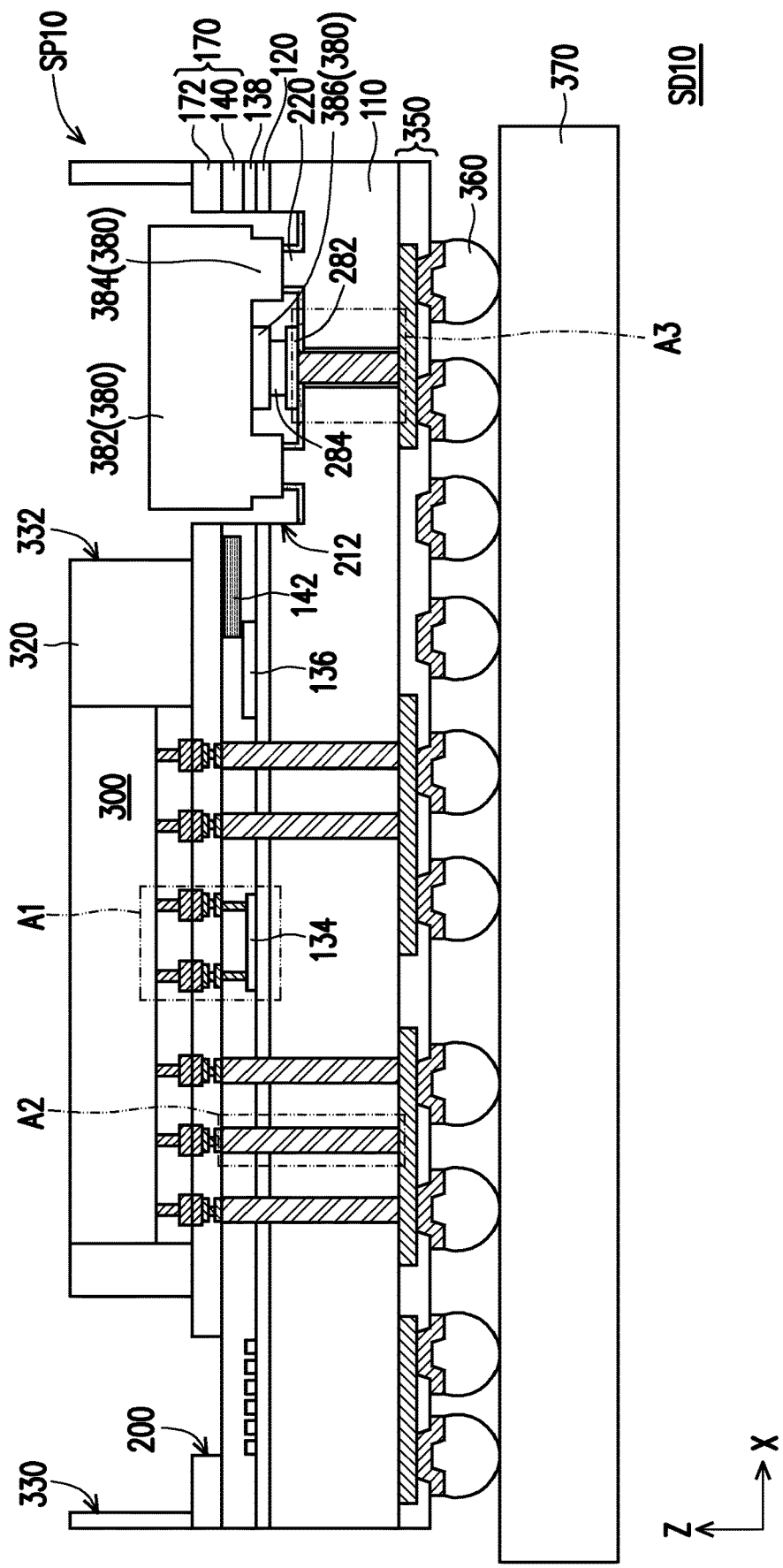

FIG. 1A to FIG. 1Q are schematic cross-sectional views illustrating a manufacturing process of a semiconductor device SD10 in accordance with some embodiments of the disclosure. Referring to FIG. 1A, a substrate 100 is provided. In some embodiments, the substrate 100 is a semiconductor-on-insulator wafer, including a bulk semiconductor layer 110, an insulator layer 120, and a front semiconductor layer 130 sequentially stacked. In some embodiments, the thickness T110 of the bulk semiconductor layer 110 is larger than the thickness T130 of the front semiconductor layer 130, so as to facilitate handling of the substrate 100. Both thicknesses T110 and T130 are measured along a stacking direction of the layers (e.g., the Z direction illustrated in FIG. 1A). The bulk semiconductor layer 110 and the front semiconductor layer 130 include one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. In some embodiments, the bulk semiconductor layer 110 and the front semiconductor layer 130 include the same material. In some alternative embodiments, the bulk semiconductor layer 110 and the front semiconductor layer 130 include different materials.

The insulator layer 120 separates the front semiconductor layer 130 from the bulk semiconductor layer 110. The insulator layer 120 may have a first surface 120i in contact with the bulk semiconductor layer 110 and a second surface 120ii opposite to the first surface 120i facing the front semiconductor layer 130. In some embodiments, the second surface 120ii may be in contact with the front semiconductor layer 130. In some embodiments, the insulator layer 120 includes dielectric materials. For example, the insulator layer 120 may include an oxide such as silicon oxide, and may be referred to as a buried oxide layer (BOX). In some embodiments, the substrate 100 may be prepared according to any one of a number of suitable approaches. For example, oxygen ions may be implanted in a semiconductor wafer, followed by an annealing step to repair damages which the implantation stage may have caused. Alternatively, a first semiconductor wafer may be bonded to an oxidized surface of a second semiconductor wafer. The first semiconductor wafer may be subsequently thinned to the desired thickness, for example through a sequence of grinding and polishing steps. Alternative processes, for example involving combinations of wafer bonding, splitting, and/or ion implantation are also possible, and are contemplated within the scope of the disclosure.

In some embodiments, the substrate 100 is in wafer form. That is, different regions of the wafer may correspond to different package units, so that multiple package units may be simultaneously manufactured from the same wafer. In the drawings, an individual package unit is shown for illustration purposes, however, multiple package units may be formed in the substrate 100, and processed together with wafer-level technology.

Referring to FIG. 1A and FIG. 1B, the front semiconductor layer 130 may be patterned to form one or more optical devices 134, and one or more waveguide patterns 132, 136. One or more ion implantation processes may also be performed in one or more regions of the front semiconductor layer 130 to form the optical devices 134. For example, the front semiconductor layer 130 may be patterned to form a grating coupler 132, one or more optical devices 134 (e.g. modulators, detectors, multiplexers, demultiplexers, etc.), linear waveguides 136 and so on. An inactive portion 138 of the front semiconductor layer 130 may also remain on the insulator layer 120, separated from the optical devices 134 and waveguide patterns 132, 136. Referring to FIG. 1B and FIG. 1C, insulating materials (e.g., oxides) may be disposed on the patterned front semiconductor layer 130 to blanketly cover the patterned front semiconductor layer 130. In some embodiments, different dielectric materials may be deposited, to form waveguides or coupling devices such as the edge coupler 142. For example, the dielectric layer 140 may include a first dielectric material, and the edge coupler 142 may include another dielectric material having a dielectric constant higher than the material of the dielectric layer 140. For example, the dielectric layer 140 may include silicon oxide, and the edge coupler 142 may include silicon nitride. As illustrated in FIG. 1C, in some embodiments the edge coupler 142 may be located in a central region of the package unit, away from the edges of the package unit. That is, the dielectric layer 140 may be interposed between the edge coupler 142 and the edges of the package unit.

In some embodiments, the waveguide patterns 132, 136 may include a core of a first material (e.g., a semiconductor material) sandwiched between two layers of a second material, where the refractive indexes of the first material and the second material are selected so as to allow internal transmission of desired modes of electromagnetic radiation. For example, the linear waveguide 136 may include a semiconductor core formed from the front semiconductor layer 130 (illustrated, e.g., in FIG. 1A). The core may be buried between the insulator layer 120 and the dielectric layer 140. The shape of the core of the waveguide is not particularly limited, and may be selected according to the application requirements. In some embodiments, the dielectric layer 140 may be the same material included in the insulator layer 120. In some embodiments, an interface between the dielectric layer 140 and the insulator layer 120 may not be particularly visible, or even invisible, depending on the materials used and the process conditions adopted. In some embodiments, the linear waveguide 136 is connected to one end to the edge coupler 142, and to the other end to one or more of the optical devices 134. The optical devices 134 may be configured to generate electric signals upon detection of the electromagnetic radiation received from the waveguide 136. The signal may then be transmitted through the interconnection structure 140 to be processed before being transmitted to other devices (not shown).

Referring to FIG. 1D, in some embodiments through semiconductor holes 150 may be formed in the bulk semiconductor layer 110, extending through the dielectric layer 140 and the insulator layer 120. In some embodiments, the through semiconductor holes 150 are blind holes, penetrating through the bulk semiconductor layer 110 for less than its total thickness T110. Through semiconductor vias (TSVs) 160 may be formed in the through semiconductor holes 150, for example through one or more deposition and/or plating steps. In some embodiments, the TSVs 160 may be formed by filling the through semiconductor holes 150 with a conductive material, for example including cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be disposed after forming optional barrier layers, seed layers, liner layers, etc. That is, the TSVs 160 may optionally include one or more barrier layers, seed layers, and/or liner layers, etc.

Referring to FIG. 1E, in some embodiments an interconnection structure 170 is formed over the bulk semiconductor layer 110. In some embodiments, the interconnection structure 170 includes the dielectric layers 140, 172, patterned conductive traces 180 embedded in the dielectric layer 172, and bonding pads 190 entrenched in the dielectric layer 172 and exposed at a top surface 172t of the dielectric layer 172. Even though the dielectric layer 172 is shown as a single layer, in practice it may comprise a plurality of stacked dielectric layers. In some embodiments, the patterned conductive traces 180 are arranged in one or more metallization tiers alternately stacked with dielectric layers of the dielectric layer 172. For example, the patterned conductive traces 180 may contact the optical devices 134, or may directly extend on the end of the TSVs 160 not buried in the bulk semiconductor layer 110. The bonding pads 190 may be formed on the patterned conductive traces 180, and be connected by the patterned conductive traces 180 to the optical devices 134 and the TSVs 160. In some embodiments, patterned conductive traces 180 of different metallization tiers may extend through the dielectric layers 172 and 140 to establish electrical connection between the optical devices 134 formed in the front semiconductor layer 130. As illustrated in FIG. 1E, the top surface 172t of the dielectric layer 172 and the top surfaces 190t of the bonding pads 190 are substantially located at the same level height along the Z direction to provide an appropriate active surface AS1 for hybrid bonding. In some embodiments, a material of the dielectric layer 172 includes polyimide, epoxy resin, acrylic resin, phenol resin, benzocyclobutene (BCB), polybenzoxazole (PBO), combinations thereof, or other suitable dielectric materials. The dielectric layer 172 may be formed by suitable fabrication techniques such as spin-on coating, lamination, chemical vapor deposition (CVD), or the like. In some embodiments, materials of the patterned conductive traces 180 and the bonding pads 190 independently includes cobalt (Co), tungsten (W), copper (Cu), titanium (Ti), tantalum (Ta), aluminum (Al), zirconium (Zr), hafnium (Hf), a combination thereof, or other suitable metallic materials. The patterned conductive traces 180 may be formed by, for example, electroplating, deposition, and/or photolithography and etching. In some embodiments, the interconnection structure 170 is formed by sequential CVD and dual damascene processes. In some embodiments, the number of metallization tiers and dielectric layers in the interconnection structure 170 may be adjusted depending on the routing requirements. In some embodiments, the bonding pads 190 may be formed by forming trenches in the dielectric layer 172 exposing the patterned conductive traces 180 at their bottom, and subsequently filling the trenches with conductive materials.

Referring to FIG. 1F, in some embodiments, the dielectric layers 172, 140 may be patterned to form recesses 200, 210. In some embodiments, the portion of the dielectric layer 172 extending over the grating coupler 132 is removed to form the recess 200. The dielectric layer 140 may be exposed at the bottom of the recess 200, so that the grating coupler 132 remains covered at the bottom of the recess 200. In some embodiments, an etch stop layer (not shown) may be formed in between the dielectric layer 140 and the dielectric layer 172 to prevent the recess 200 from reaching the grating coupler 132. After formation of the recess 200, the etch stop layer exposed at the bottom of the recess may optionally be removed. In some alternative embodiments, the depth along the Z direction of the recess 200 may be regulated by controlling the duration of the etching step when the dielectric layer 172 is patterned. In some embodiments, the recess 210 extends across both of the dielectric layer 172 and the dielectric layer 140, for example to expose the inactive portion 138 of the front semiconductor layer 130. That is, the recess 210 may be deeper along the Z direction than the recess 200. In some embodiments, the recess 210 may be formed via an additional etching step with respect to the recess 200, to further extend across the dielectric layer 140. For example, after the recess 200 is formed, a protective mask (not shown) may be provided over the recess 200, while etching is still performed to deepen the recess 210. In some embodiments, the recess 210 may be formed so that the sidewalls of the recess 200 expose or are sufficiently close to the edge coupler 142 for the edge coupler 142 to be capable of receiving external light.

Referring to FIG. 1F and FIG. 1G, in some embodiments, the recess 210 is extended to form the recess 212 by patterning the stack including the inactive portion of semiconductor material 138, the insulator layer 120 and the bulk semiconductor layer 110. That is, the stacked layers 110, 120, 138 exposed at the bottom of the recess 210 are patterned to form alignment pedestals 220. In some embodiments, the recess 210 is extended along the Z direction until a portion of the bulk semiconductor layer 110 is removed. The recess 210 may be extended during one or more etching steps, with the last etching step being performed so that the recess 210 exposes the bulk semiconductor layer 110 at its bottom, without extending through the entire thickness T110 of the bulk semiconductor layer 110. As illustrated in FIG. 1G, after the etching steps the bulk semiconductor layer 110 may present the original thickness T110 in correspondence of the alignment pedestals 220, and a reduced thickness T110r in correspondence of the bottom of the recess 212. The alignment pedestals 220 may include stacked portions of the bulk semiconductor layer 110, the insulator layer 120, and the inactive portion of semiconductor material 138. In some embodiments, the alignment pedestals 220 are formed from the bulk semiconductor layer 110, the insulator layer 120 and the front semiconductor layer 130, and are, therefore, formed as a single piece (integrally formed) with the bulk semiconductor layer 110. However, the disclosure is not limited thereto.

Referring to FIG. 1H, in some embodiments, one or more through semiconductor holes 240 are formed in the bulk semiconductor layer 110 at the bottom of the recess 212, in between the alignment pedestals 220. In some embodiments, the through semiconductor holes 240 are blind holes exposing the bulk semiconductor layer 110 at their sidewalls and at their bottom. Thereafter, through semiconductor vias (TSVs) 250 are formed in the through semiconductor holes 240. The TSVs 250 may include a seed layer 252 formed along the sidewalls and at the bottom of the through semiconductor hole 240, and a conductive material 254 formed on the seed layer 252, filling the through semiconductor hole 240. The seed layers 252 may be formed through, for example, a sputtering process, a physical vapor deposition (PVD) process, or the like. In some embodiments, the seed layers 252 may include, for example, copper, tantalum, titanium, a combination thereof, or other suitable materials. In some embodiments, additional layers (not shown) such as a barrier layer and/or a liner layer may be deposited before forming the seed layers 252 to prevent out-diffusion of the material of the seed layers 252.

In some embodiments, an insulating layer 270 is formed at the bottom of the recess 212, conformally covering the alignment pedestals 220 while leaving exposed the TSVs 250. In some embodiments, the insulating layer 270 may include a dielectric material. For example, the insulating layer 270 may include an oxide, such as silicon dioxide, and may be formed by CVD, PVD, or other suitable deposition techniques. In some embodiments one or more conductive pads 282 are formed on the one or more TSVs 250 at the bottom of the recess 212. For example, one conductive pad 282 may be formed over each TSV 250. In some embodiments, the conductive pads 282 cover the exposed ends 250i of the TSVs 250, and further extend on the insulating layer 270 adjacent to the TSVs 250. In some embodiments, the conductive pads 282 are formed through one or more deposition and/or plating steps. In some embodiments, the conductive pads 282 include, for example, cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, solder layers 284 are formed over the conductive pads 282 at the bottom of the recess 212. The solder layers 284 may include eutectic solder containing lead or lead-free. In some embodiments, the solder layers 284 include Sn, SnAg, SnPb, SnAgCu, SnAgZn, SnZn, SnBiIn, SnIn, SnAu, SnPb, SnCu, SnZnIn, SnAgSb, or similar soldering alloys. In some embodiments, the solder layers 284 include non-eutectic solder.

Referring to FIG. 1I, the recesses 200 and 212 may be filled with portions of sacrificial material 292 and 294, respectively. In some embodiments, a formation method of the sacrificial material 292 and 294 may include filling an initial sacrificial material (not shown) in the recesses 200 and 212 by, for example, a spin coating process or a deposition process. The top surface of the initial sacrificial material (not shown) may be higher than the top surface 172t of the dielectric layer 172. A portion of the initial sacrificial material above the top surface 172t of the dielectric layer 172 may be removed by a planarization process, so as to form the portions of sacrificial material 292 and 294. For instance, the planarization process may include an etching back process, a chemical mechanical planarization process, or the like. The portions of sacrificial material 292, 294 may include material similar to a die attach film (DAF), a removable glue such as an epoxy glue, other materials capable of withstanding the subsequent process steps while protecting the underlying elements (e.g., the alignment pedestals 220, the solder layers 284, the conductive pads 282, or the dielectric layer 140), or a combination thereof.

Referring to FIG. 1J, one or more semiconductor dies 300 are provided on the active surface AS1. In some embodiments, one or more semiconductor dies 300 may be disposed in a single package unit, according to design requirements. The semiconductor dies 300 may be of the same type or perform the same function, but the disclosure is not limited thereto. In some alternative embodiments, the semiconductor dies 300 disposed in a same package unit may be different from each other, or perform different functions. Briefly, a semiconductor die 300 may include a semiconductor substrate 302 in which active and/or passive devices are formed, conductive traces 304 interconnecting the active and/or passive devices with each other and with the bonding pads 306, and a dielectric layer 308 in which the conductive traces 304 and the bonding pads 306 are embedded. In some embodiments, top surfaces 306t of the bonding pads 306 and the top surface 308t of the dielectric layer 308 are part of the active surface AS2 of the semiconductor die 300.

As illustrated in FIG. 1J, the semiconductor die 300 is bonded to the dielectric layer 172 and the bonding pads 190. In some embodiments, the semiconductor die 300 may be bonded through a hybrid bonding process. In some embodiments, the semiconductor die 300 may be picked-and-placed onto the active surface AS1 such that the active surface AS2 of the semiconductor die 300 is in contact with the active surface AS1. Furthermore, the bonding pads 306 of the semiconductor die 300 are substantially aligned and in direct contact with the corresponding bonding pads 190 and the dielectric layer 308 is directly in contact with at least a portion of the dielectric layer 172. In some embodiments, the footprint of a semiconductor die 300 is smaller than a span of the package unit. That is, even after placement of the semiconductor die 300, portions of the dielectric layer 172 within a package unit may be left exposed. Similarly, the semiconductor die 300 may leave exposed the portions of sacrificial material 292, 294 within the recesses 200, 212. That is, the semiconductor die 300 may be disposed on the dielectric layer 172 without covering the filled recesses 200, 212. In some embodiments, to facilitate the hybrid bonding between the semiconductor die 300 and the package unit, surface preparation for the surfaces to be bonded (i.e. the active surfaces AS1 and the active surfaces AS2) may be performed. The surface preparation may include surface cleaning and activation, for example.

After cleaning the active surfaces AS1 and AS2, activation of the bonding surfaces of the dielectric layers 308 and 172 may be performed for development of high bonding strength. For example, plasma activation may be performed to treat the top surfaces 172t and 308t of the dielectric layers 172 and 308. After the activated top surfaces 308t and 172t of the dielectric layers 308 and 172 are in contact with each other, a hybrid bonding step is performed. The hybrid bonding step may include a thermal treatment process for dielectric bonding and a thermal annealing process for conductor bonding. In some embodiments, the temperature of the thermal annealing process for conductor bonding is higher than the temperature of the thermal treatment process for dielectric bonding. After performing the thermal annealing process for conductor bonding, the dielectric layer 172 is bonded to the overlying dielectric layer 308, and the bonding pads 306 are bonded to the underlying bonding pads 190.

Referring to FIG. 1K, dummy dies 312, 314 may be disposed on the filled recesses 200 and 212, respectively. In some embodiments, the span of the dummy dies 312, 314 is sufficient to completely cover the filled recesses 200 and 212. In some embodiments, the initial thicknesses T312i, T314i of the dummy dies may independently vary. In some embodiments, the initial thicknesses T312i, T314i are equal to or larger than the initial thickness T300i of the semiconductor die 300, so that the rear surfaces 312r, 314r of the dummy dies 312, 314 are at the same level height along the Z direction or higher than the rear surface 300r of the semiconductor die 300. However, the disclosure is not limited thereto, and, in some alternative embodiments, the initial thickness T300i of the semiconductor die 300 may be greater than the initial thicknesses T312i, T314i of the dummy dies 312, 314. In some embodiments, the dummy dies 312, 314 include semiconductor materials, such as semiconductor materials of the groups III-V of the periodic table. In some alternative embodiments, the dummy dies may include an inorganic material. In some embodiments, the inorganic material includes a metal such as copper or copper alloys, aluminum or aluminum alloys, or a combination thereof. In some alternative embodiments, the inorganic material includes a ceramic material. In some embodiments, the inorganic material includes a glass material containing silicon oxide.

In some embodiments, a filling process is performed to form an encapsulant 320 over the dielectric layer 172 to encapsulate the semiconductor die 300 and the dummy dies 312, 314. In some embodiments, the encapsulant 320 may be formed so as to fill gaps between the semiconductor die 300 and the dummy dies 312, 314 over the dielectric layer 172. In some embodiments, the encapsulant 320 may initially cover the rear surfaces 300r, 312r, 314r of the semiconductor die 300 and the dummy dies 312, 314. In some embodiments, a material of the encapsulant 320 includes inorganic materials such as silicon oxide, silicon nitride, or the like. In some alternative embodiments, a material of the encapsulant 320 includes a molding compound, a polymeric material, such as polyimide, epoxy resin, acrylic resin, phenol resin, BCB, PBO, a combination thereof, or other suitable polymer-based dielectric materials. In some embodiments, the encapsulant 320 may be formed by suitable processes, such as CVD, plasma-enhanced chemical vapor deposition (PECVD), atomic layer deposition (ALD), or the like.

In some embodiments, the thickness of the encapsulant 320 may be adjusted so that the top surface 320t of the encapsulant 320 becomes substantially coplanar (e.g., at the same level height along the Z direction) with the rear surfaces 300r, 312r, 314r of the semiconductor die 300 and the dummy dies 312, 314. By doing so, the semiconductor die 300 and the dummy dies 312, 314 are exposed by the encapsulant 320, as illustrated, for example, in FIG. 1L. In some embodiments, a portion of the encapsulant 320 is removed to adjust the thickness of the encapsulant, for example during a chemical mechanical planarization process. In some embodiments, portions of the dummy dies 312, 314 may also be removed, reducing the thickness of the dummy dies 312, 314 to the final thicknesses 312f, 314f. However, the disclosure is not limited thereto. For example, when the semiconductor die 300 is initially thicker than the dummy dies 312, 314, portions of the semiconductor die 300 may be removed until all of the semiconductor die 300 and the dummy dies 312, 314 are exposed by the encapsulant 320. That is, the final thickness T300f of the semiconductor die 300 may be smaller than the initial thickness T300i.

Referring FIG. 1L and FIG. 1M, in some embodiments the dummy dies 312, 314 may be extracted from the encapsulant, resulting in recesses 330 and 332 being respectively formed in place of the dummy dies 312, 314. In some embodiments, the recess 330 exposes at its bottom the filled recess 200, and the recess 332 exposes at its bottom the filled recess 212. Portions of the dielectric layer 172 adjacent to the recesses 200, 212 may also be exposed at the bottom of the recesses 330, 332. In some embodiments, After the dummy dies 312, 314 are removed, the sacrificial material 292, 294 is also removed from the recesses 200, 212, thus exposing again the dielectric layer 200 at the bottom of the recess 200, and the insulating layer 270, the conductive pads 282 and the solder layer 284 at the bottom of the recess 232. Thereafter, portions of sacrificial material 342, 344 are filled in the recesses 200, 330 and 212, 312, respectively, as illustrated in FIG. 1N. The sacrificial material 342, 344 may be formed with similar processes and include similar material as previously described for the sacrificial material 292, 294. Upon filling of the recesses 200, 330, 212, 312, the system may be overturned, so as to expose the bottom surface 110b of the bulk semiconductor layer 110 for further processing.

Referring to FIG. 1O, the bulk semiconductor layer 110 may be thinned from the side of the bottom surface 110b until the buried ends of the TSVs 160, 250 are exposed. The thinning of the bulk semiconductor layer 110 may involve one or more etching processes, a chemical mechanical planarization process, or the like. After the TSVs 160, 250 are exposed at the level of the bottom surface 110b, an interconnection structure 350 may be formed on the bulk semiconductor layer 110. The interconnection structure 350 may include a dielectric layer 352, conductive traces 354, and, optionally, under-bump metallurgies 356. In some embodiments, the conductive traces 354 establish electrical contact with one or more of the TSVs 160 and 250. For example, some of the conductive traces 354 may interconnect some of the TSVs 160 with each other. In some embodiments, the dielectric layer 352 includes openings exposing portions of the conductive traces 354. The number of dielectric layers 352 and conductive traces 354 may be selected according to routing requirements, and multiple interconnection tiers may be stacked over each other if required. When the under-bump metallurgies 356 are included, the under-bump metallurgies are formed in the openings of the dielectric layer 352 to contact the conductive traces 354. In some embodiments, the under-bump metallurgies 356 may partially extend on the dielectric layer 352 surrounding the openings. In some embodiments, a material of the dielectric layer 352 includes polyimide, epoxy resin, acrylic resin, phenol resin, benzocyclobutene (BCB), polybenzooxazole (PBO), combinations thereof, or other suitable dielectric materials. The dielectric layer 352 may be formed by suitable fabrication techniques such as spin-on coating, lamination, chemical vapor deposition (CVD), or the like. In some embodiments, materials of the conductive traces 354 includes cobalt (Co), tungsten (W), copper (Cu), titanium (Ti), tantalum (Ta), aluminum (Al), zirconium (Zr), hafnium (Hf), a combination thereof, or other suitable metallic materials. The conductive traces 354 may be formed by, for example, electroplating, deposition, and/or photolithography and etching. In some embodiments, a material of the under-bump metallurgies 356 includes copper, nickel, tin, palladium, gold, titanium, aluminum, or alloys thereof. In some embodiments, multiple layers of conductive material may be stacked to form the under-bump metallurgies 356. In some embodiments, the under-bump metallurgies 356 may be formed by a plating process. The plating process is, for example, electro-plating, electroless-plating, immersion plating, or the like.

In some embodiments, conductive terminals 360 are formed on the under-bump metallurgies 356 or on the exposed portions of the conductive traces 354 (if formation of the under-bump metallurgies 356 is skipped). In some embodiments, the conductive terminals 360 include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e. g, a metal pillar with a solder ball attached), or the like. In some embodiment, when the process is performed in a wafer form, the package units may be singulated if required, for example by cutting along cutting lines C with a laser saw or a mechanical saw, to produce a plurality of semiconductor packages SP10.

Referring to FIG. 1O and FIG. 1P, in some embodiments a semiconductor package SP10 may be disposed on a circuit substrate 370 and connected to the circuit substrate 370 through the conductive terminals 360, to be integrated with other devices. In some embodiments, the circuit substrate 370 may be a printed circuit board, or the like. Before or after connection to the circuit substrate 370, the sacrificial material 342, 344 may be removed from the recesses 200, 330, 212, 332. In some embodiments the structure illustrated in FIG. 1P may be obtained from the structure illustrated in FIG. 1L following a different manufacturing process. For example, the structure illustrated in FIG. 1L may be overturned without removing the dummy dies 312, 314. Then, the interconnection structure 350 and the conductive terminals 360 may be formed, as described before with reference to FIG. 1O. Thereafter, the semiconductor package SP10 may be bonded to the circuit substrate 370, and, before or after bonding, the dummy dies 312, 314 and the sacrificial material 292, 294 may be removed, thus forming the structure illustrated in FIG. 1P. By doing so, the formation of the sacrificial material 342, 344 may be skipped.

Figure 2A:
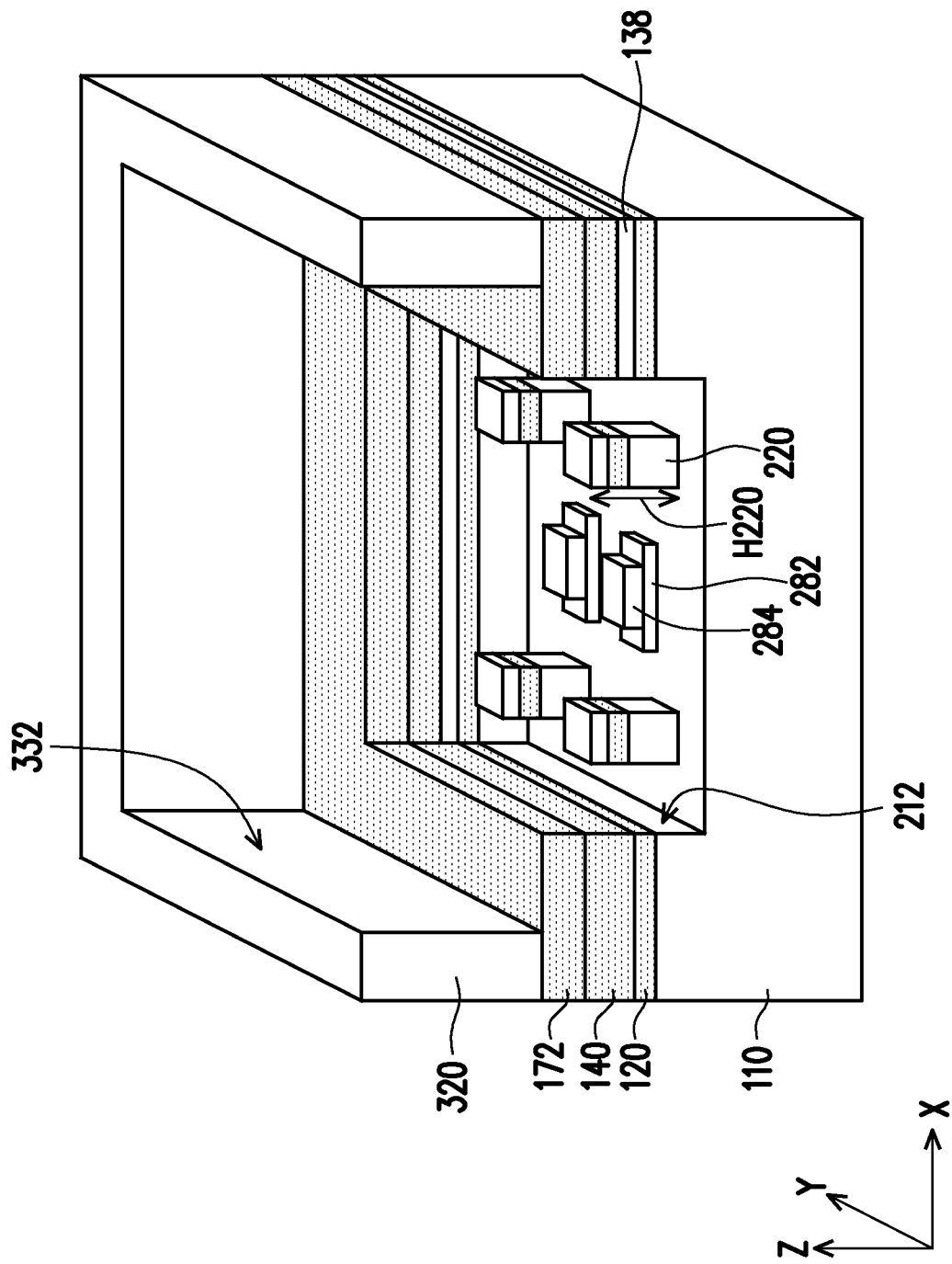
FIG. 2A is a schematic perspective view of a portion of a semiconductor device according to some embodiments of the disclosure.
Figure 2B:
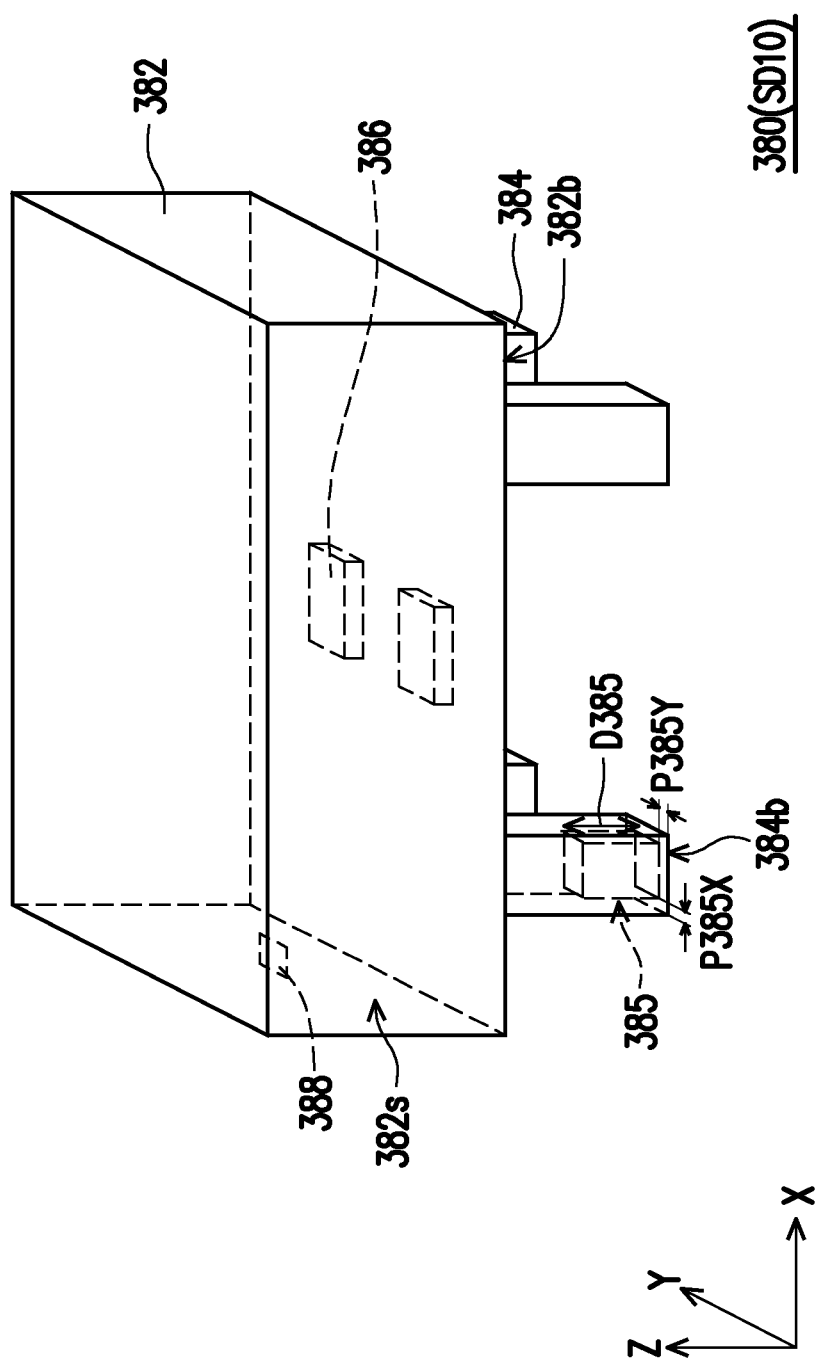
FIG. 2B is a schematic perspective view of a light-emitting die according to some embodiments of the disclosure.
Figure 3:
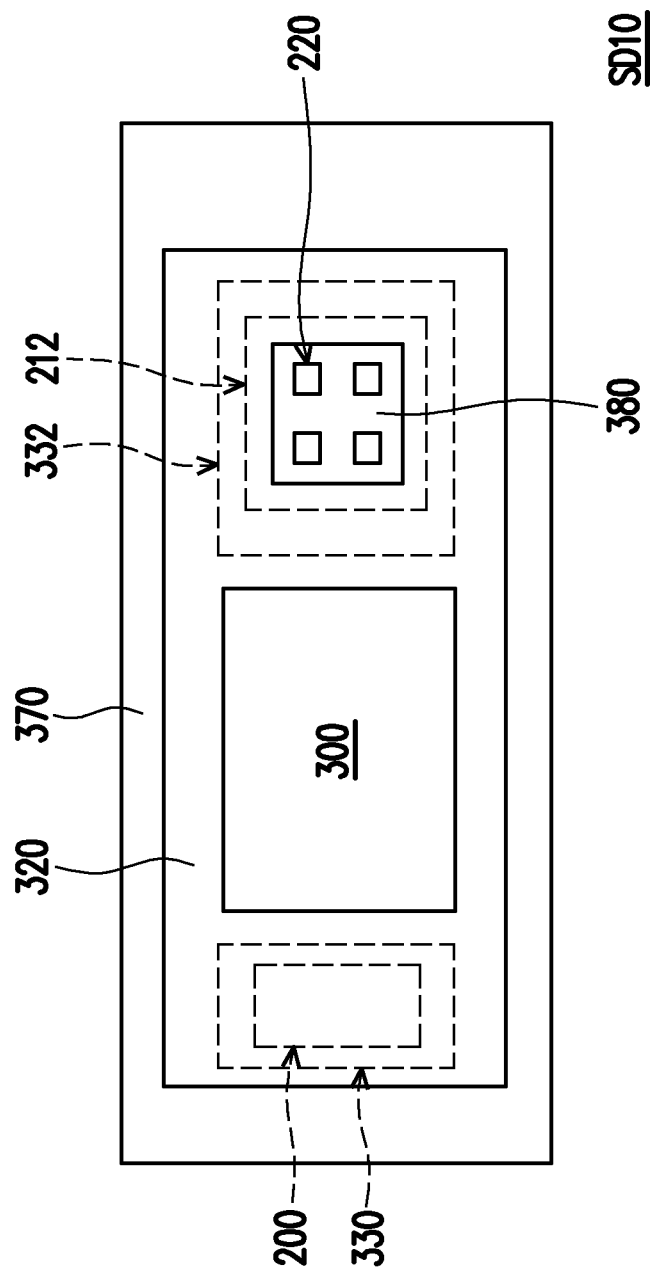
FIG. 3 is a schematic top view of a semiconductor device according to some embodiments of the disclosure.

FIG. 1Q is a schematic cross-sectional view of a semiconductor device SD10 according to some embodiments of the disclosure. FIG. 2A is a schematic perspective view of the region of the semiconductor device SD10 including the recesses 332, 212. FIG. 2B is a schematic perspective view of a light-emitting die 380 according to some embodiments of the disclosure. FIG. 3 is a schematic top view of the semiconductor device SD10 according to some embodiments of the disclosure. Referring to FIG. 1Q, FIG. 2A, FIG.

2B, and FIG. 3, in some embodiments, the recesses 330, 332 of the encapsulant 320 and the underlying recesses 200, 212 may be formed in a concentric manner, with the larger recesses 330, 332 encircling the smaller recesses 200, 212. In some embodiments, the recess 200 may be adapted to receive a light source (not shown). For example, an optical fiber may be disposed in the recess 200, so that light emitted by the optical fiber may be directed by the grating coupler 132 to waveguides 136 and to the optical devices 134.

In some embodiments the light-emitting die 380 may be disposed in the recess 212 on the alignment pedestals 220. In some embodiments, the light-emitting die 380 includes a substrate 382, and supporting pillars 384 connected to a bottom surface 384b of the substrate 382. In some embodiments, the substrate 382 is a semiconductor substrate. In some embodiments, the supporting pillars 384 may be integrally formed with the substrate 382. For example, portions of the substrate 382 may be selectively removed so as to form the supporting pillars 384. In some alternative embodiments, the supporting pillars 384 may be separate structure, which are secured to the substrate 382, for example via threaded extremities (not shown). In some embodiments, alignment recesses 385 are formed in the supporting pillars 384 to accommodate the alignment pedestals 220. That is, upon disposing the light-emitting die 380 in the recess 212, the alignment pedestals 220 may be received in the alignment recesses 385. Conductive pads 386 may be formed at the bottom surface 384b of the semiconductor substrate 382 to connect the light-emitting die 380 to the solder layers 284, and, through the conductive pads 282 and the TSV 250, to the circuit substrate 370. That is, the light-emitting die 380 may be flip-chip bonded to the semiconductor package SP10. With such connection, the power and the signals to control and drive the light-emitting die 380 may be provided through the TSVs 250, thus avoiding the need to wire-bond the light-emitting die 380 to the circuit substrate 370. It should be noted that while two conductive pads 282 and two solder layers 284 are illustrated in FIG. 2A, the disclosure is not limited thereto. The number of conductive pads 282, solder layers 284 and TSVs 250 may be selected according to routing and production requirements, and fewer or more than the two illustrated in FIG. 2A are possible. In some embodiments, by directly connecting the light-emitting die 380 to the semiconductor package SP10, the footprint occupied by wire-bonded light-emitting modules may be saved, or used for integration of additional components.

In some embodiments, the light-emitting die 380 includes a semiconductor laser or a semiconductor light-emitting diode, and presents an emission region 388 at one of the side surfaces 382s of the substrate 382. In some embodiments, light emitted by the light-emitting die 380 from the emission region 388 is received by the edge coupler 142 and is transmitted by the waveguides 136 to be processed by the devices of the semiconductor package SP10 (e.g., the optical devices 134 and/or the devices of the semiconductor die 300). In some embodiments, the alignment pedestals 220 and the alignment recesses 385 are formed so that the emission region 388 is aligned with the edge coupler 142 when the light-emitting die 380 is disposed in the recess 212. For example, the height H220 of the alignment pedestals 220 and the depth D385 of the alignment recesses 385 may be designed so as to provide the desired alignment along the Z direction. Similarly, if the bottom of the recess 212 is considered to approximate an XY plane, the positions of the alignment pedestals 220 may be selected together with the positions P385X, P385Y of the alignment recesses 385 with respect to the bottom surface 384b of the supporting pillars so as to provide the desired alignment along the X and Y direction. In other words, the position and dimensions of the alignment pedestals 220 and the alignment recesses 385 may be selected so as to provide and facilitate three-dimensional alignment of the light-emitting die 380 with the edge coupler 142. In some embodiments, directly aligning the light-emitting die 380 to the edge coupler 142 may reduce the number of optics required to couple the light emitted by the light-emitting die 380 to the optical devices 134, thus simplifying the manufacturing process and lowering the production costs. It should be noted that while four alignment pedestals 220 and four supporting pillars 384 are illustrated in FIG. 2A and FIG. 2B, the disclosure is not limited thereto. The number of alignment pedestals 220 and supporting pillars 384 may be selected according to production requirements, and fewer or more than the four illustrated in FIG. 2A and FIG. 2B are possible.

Figure 4:
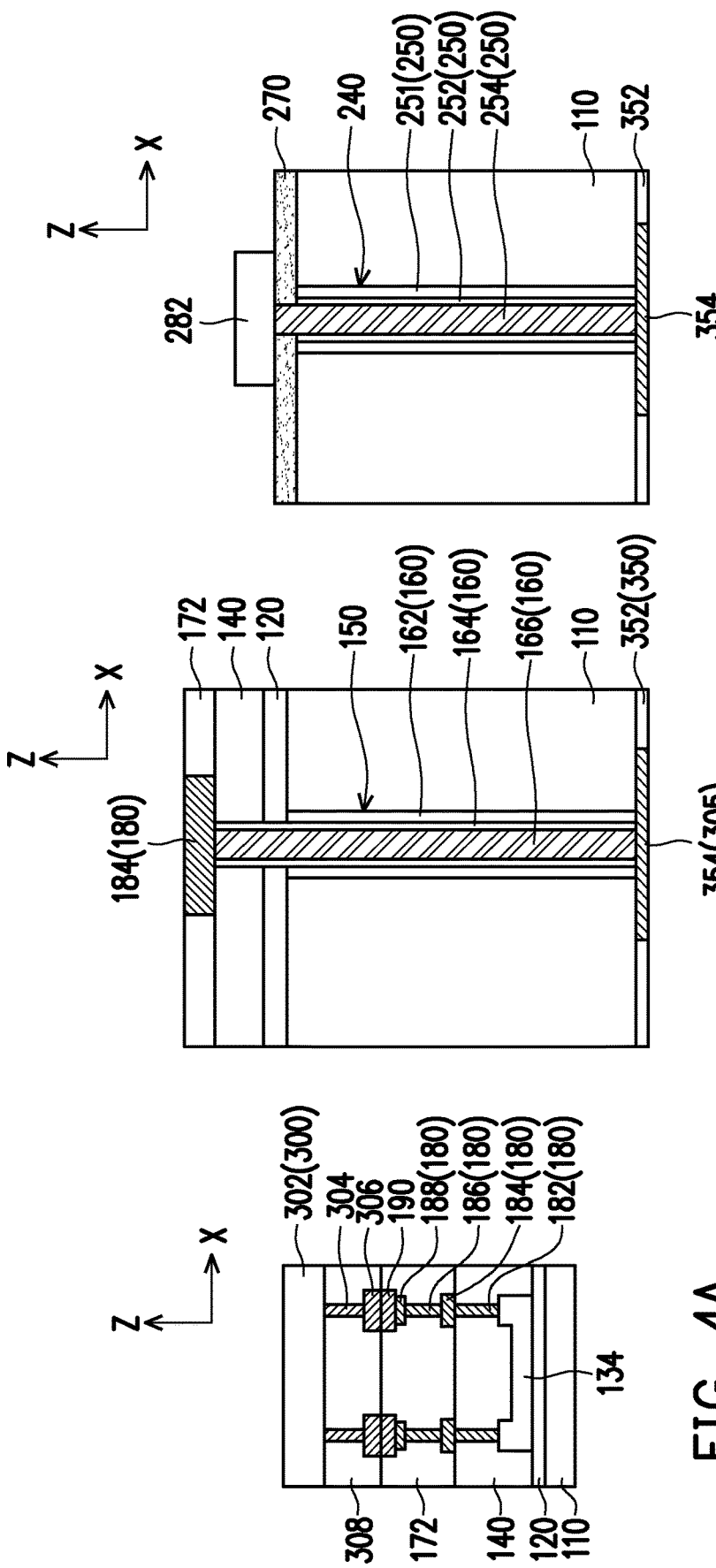
FIG. 4A to FIG. 4C are schematic cross-sectional views of regions of a semiconductor device according to some embodiments of the disclosure.

FIG. 4A is a schematic cross-sectional view of the region of the semiconductor device SD10 corresponding to the area A1 in FIG. 1Q, showing some details of the connection between the optical devices 134 and the semiconductor die 300 according to some embodiments of the disclosure. According to some embodiments, the patterned conductive traces 180 may include bottom vias 182 extending through the dielectric layer 140 to contact the optical devices 134, first traces 184 formed on the dielectric layer 140 at one end of the bottom vias 182, upper vias 186 vertically extending (along the Z direction) through the dielectric layer 172 to land on the first traces 184, and upper traces 188 formed at the opposite end of the upper vias 186 with respect to the first traces 184. The bonding pads 190 may be formed on the upper traces 186, and be connected by the patterned conductive traces 180 to the optical devices 134 and the TSVs 160. In some embodiments the conductive traces 184 or 188 with the corresponding underlying conductive vias 182 or 186 may be considered a metallization tier of the interconnection structure 170. In some embodiments, patterned conductive traces 180 of different metallization tiers may extend through the dielectric layers 140 and 172 to establish electrical connection between the optical devices 134 formed in the front semiconductor layer 130.

FIG. 4B is a schematic cross-sectional view of the region of the semiconductor device SD10 corresponding to the area A2 in FIG. 1Q, showing some details of the TSVs 160 according to some embodiments of the disclosure. The TSVs 160 are formed in the through semiconductor holes 150, and, in some embodiments, protrude from the through semiconductor hole 150 along the Z direction to also extend across the insulating layer 120 and the dielectric layer 140. In some embodiments, some of the first traces 184 of the patterned conductive traces 180 may directly extend on the ends of the TSVs 160 protruding from the bulk semiconductor layer 110. At the opposite end, the TSVs 160 may contact the conductive traces 354 of the interconnection structure 350. In some embodiments, forming the TSVs 160 includes forming a liner layer 162 within the through semiconductor holes 150 before forming a seed layer 164 on the liner layer 164 and a conductive material 166 on the seed layer 164. The liner layer 162 may be an oxide layer, for example a silicon oxide layer. The silicon oxide layer may be formed by local oxidation of silicon, or by a deposition process. The seed layer 164 and the conductive material 166 may be formed following similar processes as discussed above for the seed layer 252 and the conductive material 254, respectively. In some embodiments, the conductive traces 354 may contact all of the liner layer 162, the seed layer 164, and the conductive material 166, while the first traces 184 may contact the seed layer 164 and the conductive material 166, but not the liner layer 162. For example, the liner layer 162 may extend from the conductive trace 354 up to the insulating layer 120 along the sidewalls of the through semiconductor hole 150.

FIG. 4C is a schematic cross-sectional view of the region of the semiconductor device SD10 corresponding to the area A3 in FIG. 1Q, showing some details of the TSVs 250 according to some embodiments of the disclosure. The TSVs 250 are formed in the through semiconductor holes 240, and, in some embodiments, further extend across the insulating layer 270. In some embodiments, the conductive pads 282 may directly extend on the ends of the TSVs 250 surrounded by the insulating layer 270. At the opposite end, the TSVs 250 may contact the conductive traces 354 of the interconnection structure 350. In some embodiments, forming the TSVs 250 includes forming liner layers 251 within the through semiconductor holes 240 before forming the seed layer 252 and the conductive material 254. The liner layer 251 may be an oxide layer, for example a silicon oxide layer. The silicon oxide layer may be formed by local oxidation of silicon, or by a deposition process. In some embodiments, the conductive traces 354 may contact all of the liner layer 251, the seed layer 252, and the conductive material 254, while the first traces 184 may contact the conductive material 254 but not the liner layer 251, or the seed layer 252. That is, the seed layer 252 and the liner layer 251 may stop at the same level height as the bulk semiconductor layer 110, and have the insulating layer 270 extending on top. For example, the liner layer 251 and may extend from the conductive trace 354 up to the insulating layer 270 along the sidewalls of the through semiconductor hole 240, and the seed layer 252 may extend on the liner layer 251.

Figure 5:
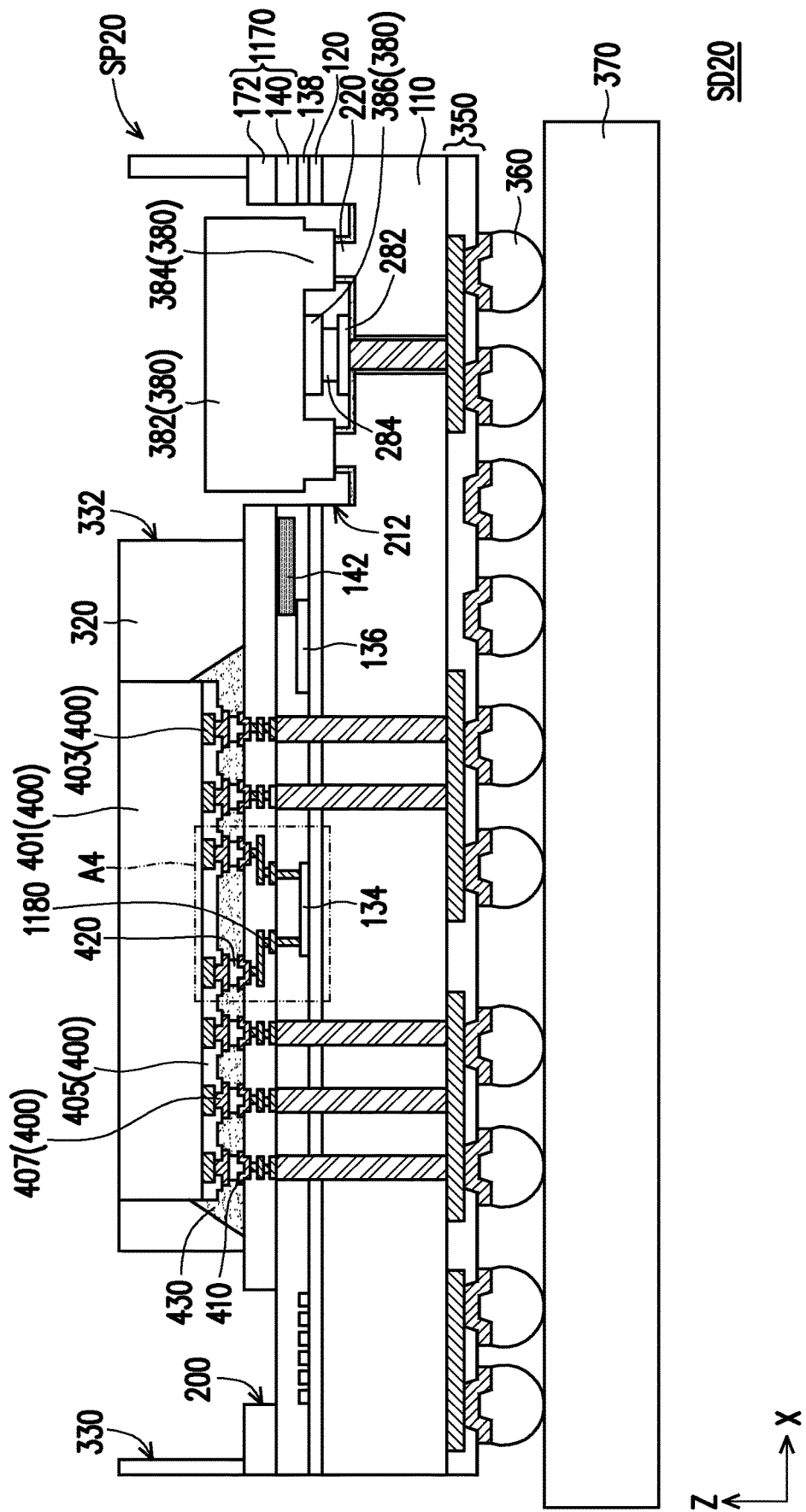
FIG. 5 is a schematic cross-sectional view of a semiconductor device according to some embodiments of the disclosure.

FIG. 5 is a schematic cross-sectional view of a semiconductor device SD20 according to some embodiments of the disclosure. The semiconductor device SD20 may include similar components and be fabricated following similar processes as the semiconductor device SD10. For example, the semiconductor device SD20 may include the semiconductor package SP20 connected to the circuit substrate 370 by the conductive terminals 360. The semiconductor package SP20 may include the bulk semiconductor layer 110 having the insulating layer 120 and the dielectric layers 140 and 172 formed thereon. Grating coupler(s) 132, optical device(s) 134, linear waveguide(s) 136, and inactive portion(s) of semiconductor material 138 may be formed on the insulating layer 120, between the insulating layer 120 and the dielectric layer 140. The edge coupler 142 may be formed in the dielectric layer 140, configured to guide incoming light into the linear waveguide(s) 136. TSVs 160 may be formed through the bulk semiconductor layer 110, the insulating layer 120, and the dielectric layer 140. The interconnection structure 350 may be formed on the bulk semiconductor layer 110 at an opposite side with respect to the insulating layer 120. The recesses 200 and 212 may also be formed similarly to what was previously described, with the alignment pedestals 220 formed at the bottom of the recess 212 to facilitate alignment of the light-emitting die 380 to the edge coupler 142. The light-emitting die 380 may be bonded through conductive pads 386, 282 and a solder layer 284 to the semiconductor package SP20, and be connected to the circuit substrate 370 by the TSVs 250. A difference between the semiconductor device SD20 and the semiconductor device SD10 of FIG. 1Q lies in the semiconductor die 400 being connected by conductive bumps 410 to the interconnection structure 1170 disposed over the bulk semiconductor layer 110, rather than being hybrid-bonded.

Figure 6:
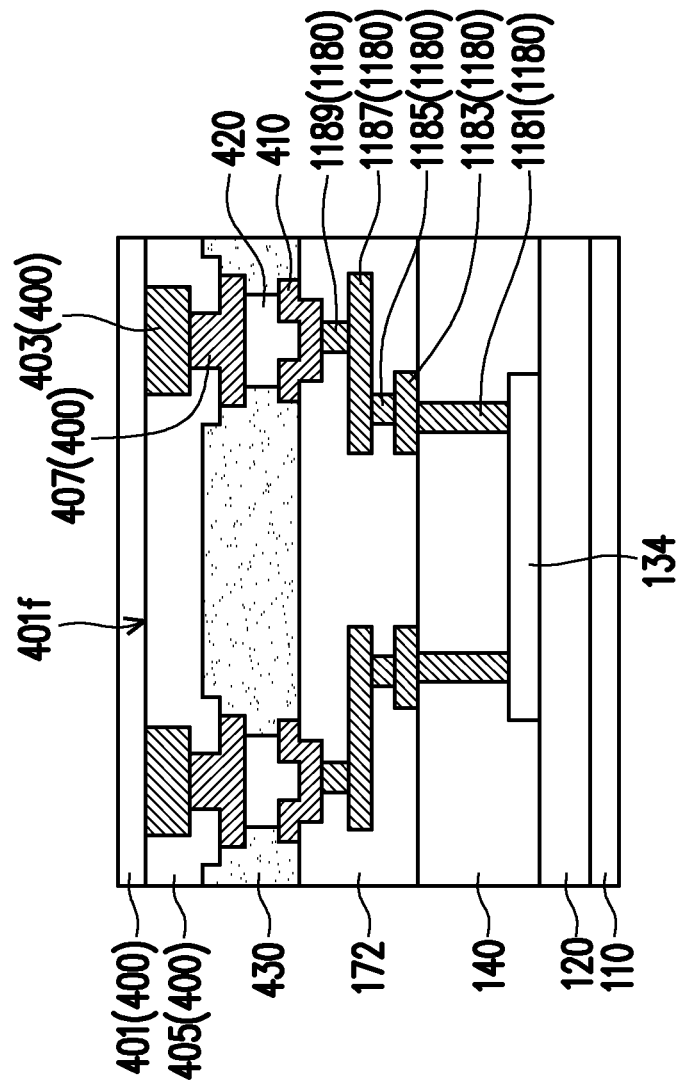
FIG. 6 is a schematic cross-sectional view of a region of a semiconductor device according to some embodiments of the disclosure.

FIG. 6 is a schematic cross-sectional view of the region of the semiconductor device SD20 corresponding to the area A4 in FIG. 5, showing some details of the interconnection structure 1170 connecting the optical devices 134 and the semiconductor die 400 according to some embodiments of the disclosure. Referring to FIG. 5 and FIG. 6, in some embodiments, the semiconductor die 400 includes the semiconductor substrate 401, contact pads 403 formed at front surface 401f of the semiconductor substrate 401, a dielectric layer 405 covering the front surface 401f of the semiconductor substrate 401 and including openings exposing the contact pads 403, and, optionally, conductive posts 407 filling the openings of the dielectric layer 405. On the side of the optical devices 134, the patterned conductive traces 1180 may extend through the dielectric layers 140 and 172 to reach under-bump metallurgies 410 formed on the dielectric layer 172. According to some embodiments, the patterned conductive traces 1180 may include bottom vias 1181 extending through the dielectric layer 140 to contact the optical devices 134, first traces 1183 formed on the dielectric layer 140 at one end of the bottom vias 1181, intermediate vias 1185 vertically extending (along the Z direction) through the dielectric layer 172 to land on the first traces 1183, upper traces 1187 formed at the opposite end of the upper vias 1185 with respect to the first traces 1183, and, optionally, upper vias 1189 extending from the upper traces 1187 to the under-bump metallurgies 410. In some embodiments, a solder bump (e.g., a solder ball) 420 may connect the conductive posts 407 (or the contact pads 403) to the under-bump metallurgies 410. In some embodiments, an underfill 430 may be disposed between the semiconductor die 400 and the dielectric layer 172 to protect the solder bumps 420 from thermal and mechanical stresses.

Figure 7:
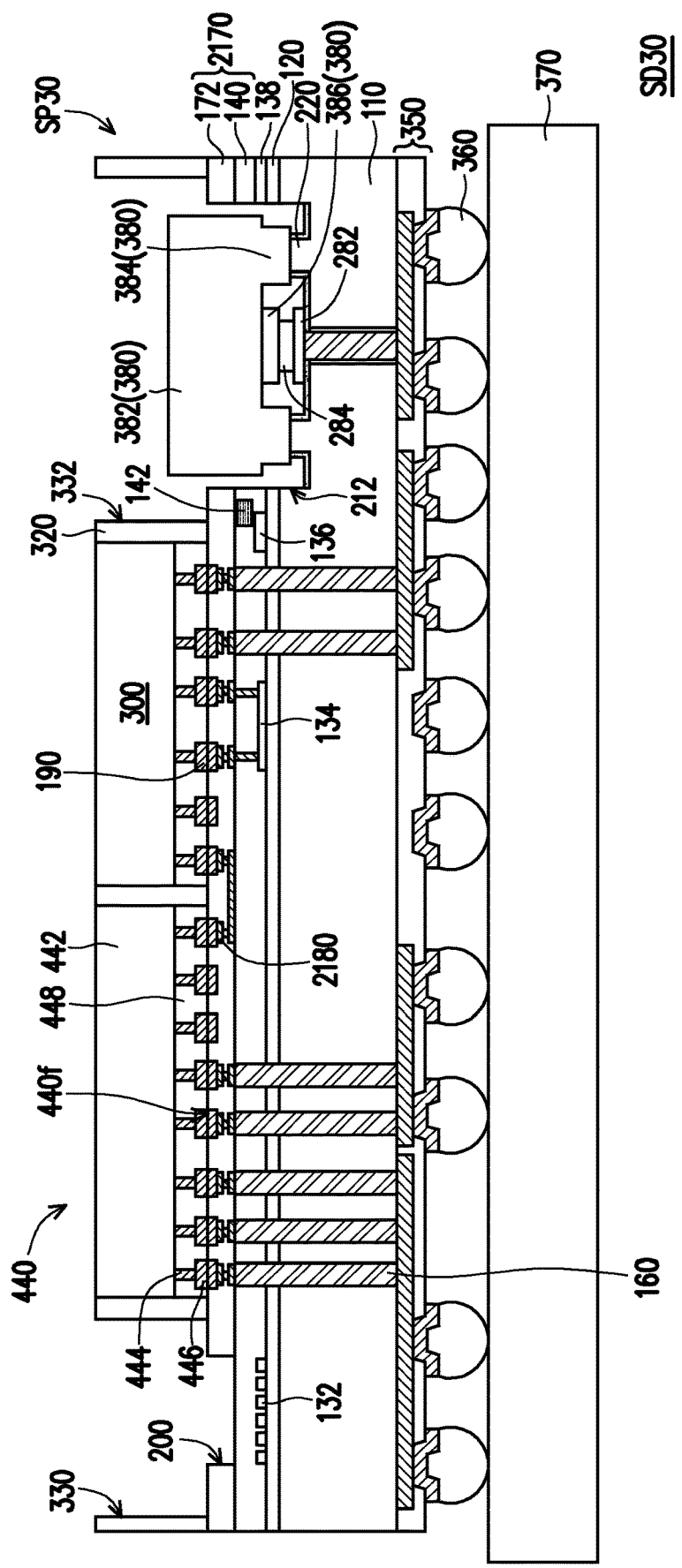
FIG. 7 is a schematic cross-sectional view of a semiconductor device according to some embodiments of the disclosure.
Figure 8:
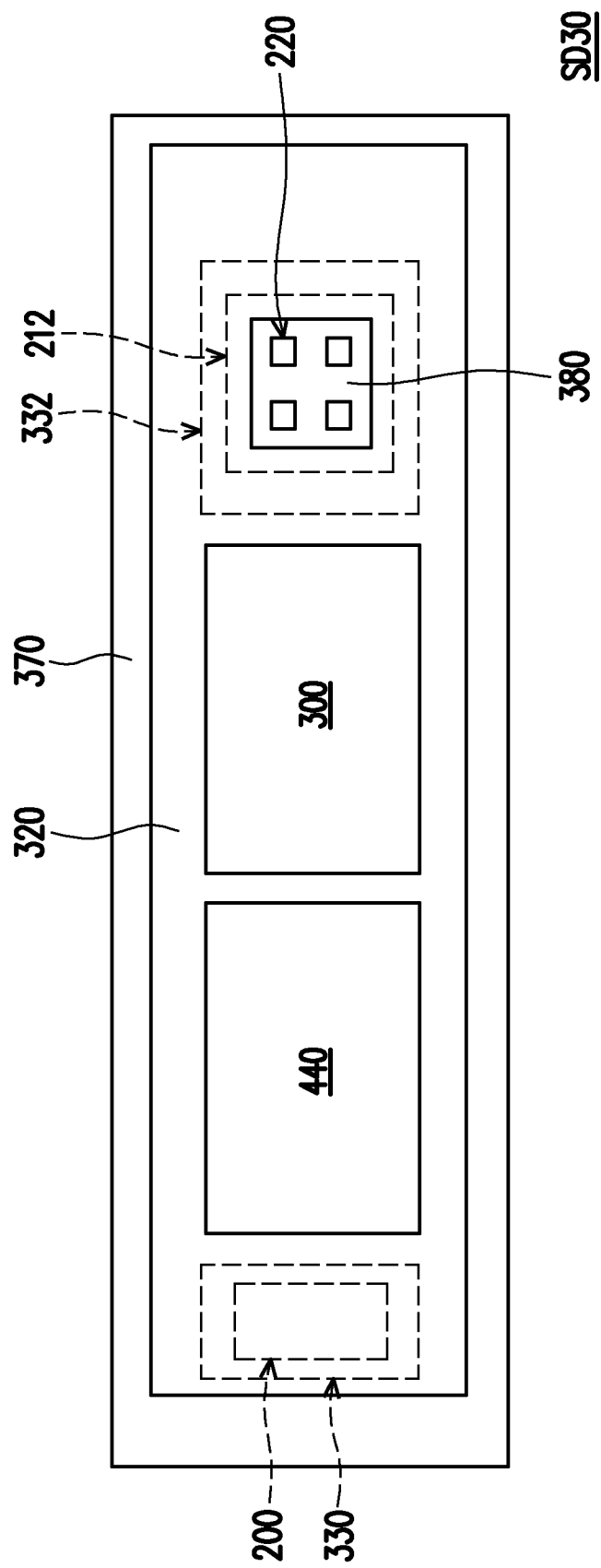
FIG. 8 is a schematic top view of a semiconductor device according to some embodiments of the disclosure.

FIG. 7 is a schematic cross-sectional view of a semiconductor device SD30 according to some embodiments of the disclosure. FIG. 8 is a schematic top view of the semiconductor device SD30 according to some embodiments of the disclosure. The semiconductor device SD30 may include similar components and be fabricated following similar processes as the semiconductor device SD10. For example, referring to FIG. 7 and FIG. 8, the semiconductor device SD30 may include the semiconductor package SP30 connected to the circuit substrate 370 by the conductive terminals 360. The semiconductor package SP30 may include the bulk semiconductor layer 110 having the insulating layer 120 and the dielectric layers 140 and 170 formed thereon. Grating coupler(s) 132, optical device(s) 134, linear waveguide(s) 136, and inactive portion(s) of semiconductor material 138 may be formed on the insulating layer 120, between the insulating layer 120 and the dielectric layer 140. The edge coupler 142 may be formed in the dielectric layer 140, configured to guide incoming light into the waveguide(s) 136. TSVs 160 may be formed through the bulk semiconductor layer 110, the insulating layer 120, and the dielectric layer 140. The interconnection structure 350 may be formed on the bulk semiconductor layer 110 at an opposite side with respect to the insulating layer 120. The recesses 200 and 212 may also be formed similarly to what was previously described, with the alignment pedestals 220 located at the bottom of the recess 212 to facilitate alignment of the light-emitting die 380 to the edge coupler 142. The light-emitting die 380 may be bonded through conductive pads 386, 282 and a solder layer 284 to the semiconductor package SP30, and may be connected to the circuit substrate 370 by the TSVs 250. A difference between the semiconductor device SD30 and the semiconductor device SD10 of FIG. 1Q lies in the semiconductor package SP30 including multiple semiconductor dies 300, 440. In some embodiments, the semiconductor die 440 may have a similar structure to the semiconductor die 300, including a semiconductor substrate 442, and conductive traces 444 and bonding pads 446 embedded in the dielectric layer 448. The bonding pads 446 may be exposed at the front surface 440f of the semiconductor die 440. In some embodiments, the semiconductor dies 300, 440 are hybrid bonded to the bonding pads 190, and are connected to the TSVs 160 by the patterned conductive traces 2180 of the interconnection structure 2170. In some embodiments, some of the patterned conductive traces 2180 directly interconnect the semiconductor dies 300, 440 with each other. In some embodiments, the semiconductor dies 300, 440 may perform different functions. For example, the semiconductor die 300 may be configured to process signals received from the optical devices 134, while the semiconductor die 440 may be an application-specific integrated circuit configured to process signals received from the semiconductor die 300. However, the disclosure is not limited thereto, and different combinations of semiconductor dies 300, 440 may be possible according to routing and production requirements. In some embodiments, the semiconductor dies 300, 440 may be disposed beside each other, in between the recesses 330, 332 of the encapsulant 320.

Figure 9:
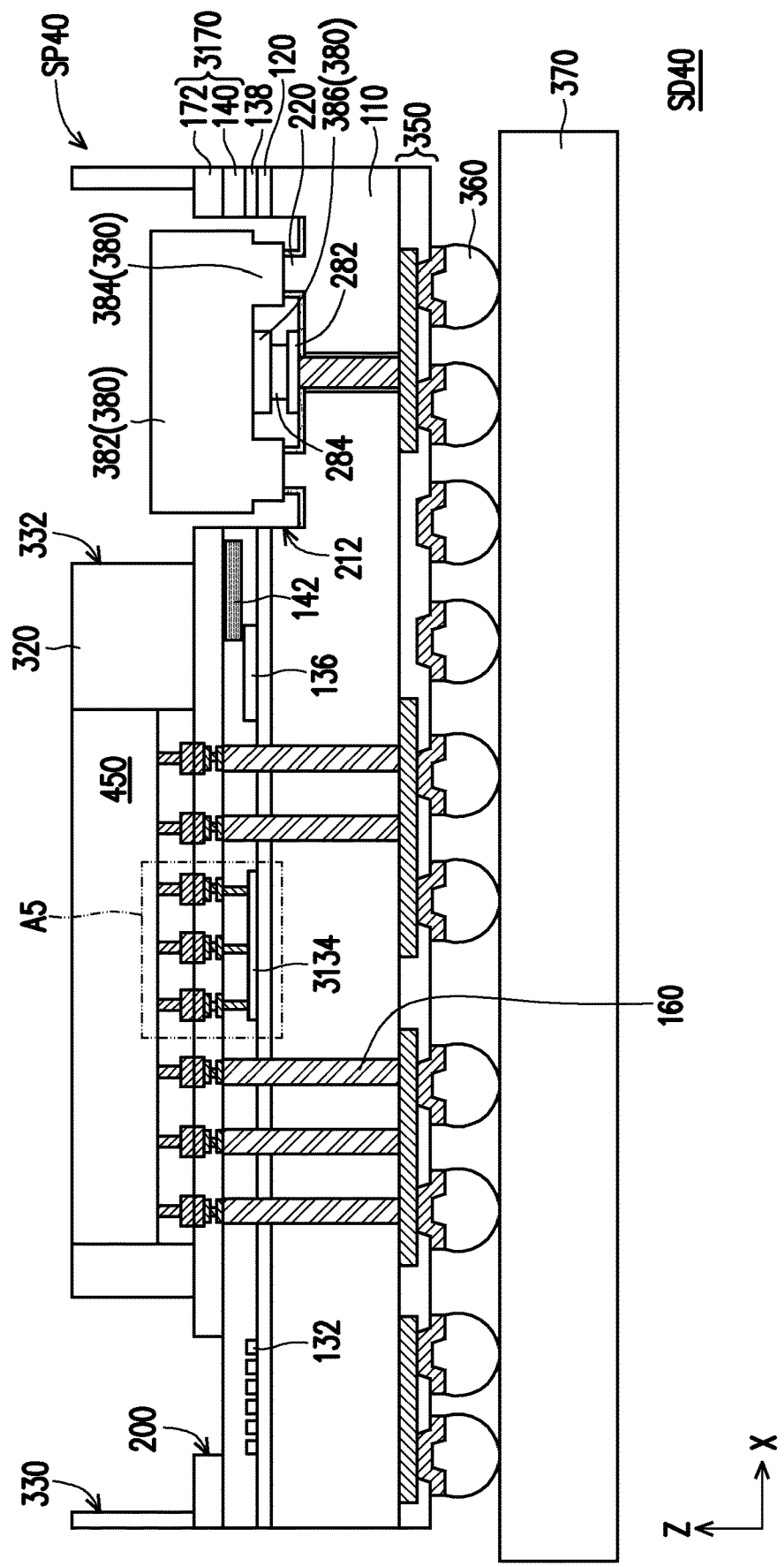
FIG. 9 is a schematic cross-sectional view of a semiconductor device according to some embodiments of the disclosure.

FIG. 9 is a schematic cross-sectional view of a semiconductor device SD40 according to some embodiments of the disclosure. The semiconductor device SD40 may include similar components and be fabricated following similar processes as the semiconductor device SD10 of FIG. 1Q. For example, the semiconductor device SD40 may include the semiconductor package SP40 connected to the circuit substrate 370 by the conductive terminals 360. The semiconductor package SP40 may include the bulk semiconductor layer 110 having the insulating layer 120 and the dielectric layers 140 and 172 formed thereon. Grating coupler(s) 132, optical device(s) 3134, linear waveguide(s) 136, and inactive portion(s) of semiconductor material 138 may be formed on the insulating layer 120, between the insulating layer 120 and the dielectric layer 140. The edge coupler 142 may be formed in the dielectric layer 140, configured to guide incoming light into the linear waveguide(s) 136. TSVs 160 may be formed through the bulk semiconductor layer 110, the insulating layer 120, and the dielectric layer 140. The interconnection structure 350 may be formed on the bulk semiconductor layer 110 at an opposite side with respect to the insulating layer 120. The recesses 200 and 212 may also be formed similarly to what was previously described, with the alignment pedestals 220 located at the bottom of the recess 212 to facilitate alignment of the light-emitting die 380 to the edge coupler 142. The light-emitting die 380 may be bonded through conductive pads 386, 282 and a solder layer 284 to the semiconductor package SP30, and may be connected to the circuit substrate 370 by the TSVs 250. A difference between the semiconductor device SD40 and the semiconductor device SD10 of FIG. 1Q lies in the way the semiconductor die 450 is connected to at least one of the optical devices 3134.

Figure 10:
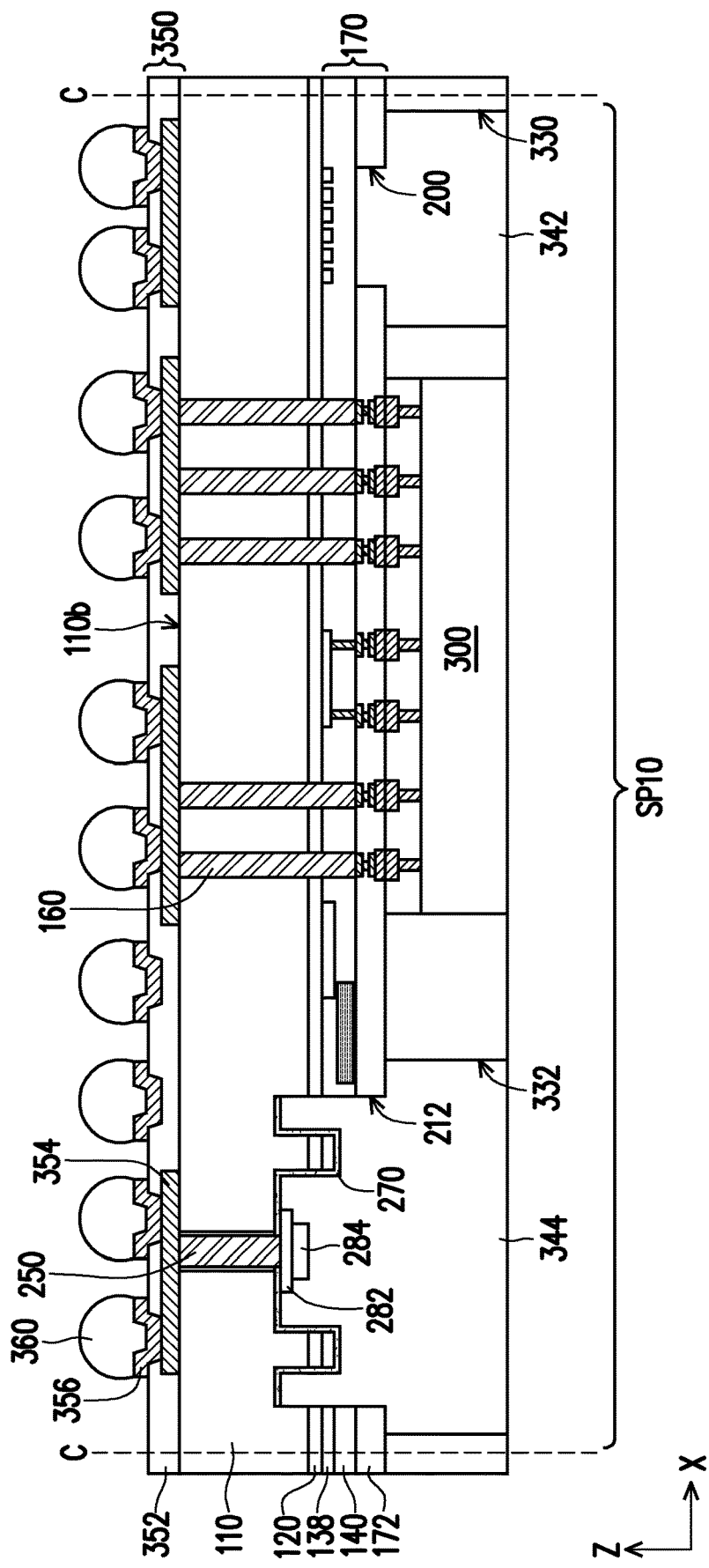
FIG. 10A is a schematic cross-sectional view of a region of a semiconductor device according to some embodiments of the disclosure.
FIG. 10B is a schematic perspective view of a region of a semiconductor device according to some embodiments of the disclosure.
FIG. 10C is a schematic top view of a region of a semiconductor device according to some embodiments of the disclosure.

FIG. 10A is a schematic cross-sectional view of the region of the semiconductor device SD40 corresponding to the area A5 of FIG. 9. FIG. 10B is a schematic perspective view of the bonding pads 456, 458, 3192, 3194 interconnecting the semiconductor die 450 and the optical device 3134. FIG. 10C is a schematic top view of the bonding pads 456, 458, interconnecting the semiconductor die 450 and the optical device 3134. The cross-sectional view of FIG. 10A may be taken in correspondence of the line I-I' illustrated in FIG. 10C. Referring to FIG. 10A, FIG. 10B, and FIG. 10C, the semiconductor die 450 may have a similar structure to the semiconductor die 300, including a semiconductor substrate 452 and a dielectric layer 454 in which conductive traces 455 and bonding pads 456, 458 are embedded. In some embodiments, the optical device 3134 is a ring modulator having a concentric structure, including a peripheral annular region 3134A and a core region 3134B encircled (totally or partially) by the peripheral annular region 3134A. In some embodiments, the peripheral annular region 3134A may encircle the core region 3134B only partially, and a waveguide 3136 may extend beside the peripheral annular region 3134A and the core region 3134B. In some embodiments, a diameter W3134B of the core region 3134B may be in the range from 5 μm to 15 μm. For example, the diameter W3134B may be about 10 micrometers. In some embodiments, the peripheral annular region 3134A and the core region 3134B may both include a semiconductor material, but may differ in terms of composition (e.g., type of material, type of doping, and/or dopant concentration, etc.). For example, the peripheral annular region 3134A may include a semiconductor material of a first conductivity type (e.g., p-type conductivity), and the core region 3134B may include a semiconductor material of opposite conductivity type (e.g., n-type conductivity). The peripheral annular region 3134A and the core region 3134B may be reached by lower conductive vias 3182 extending through the dielectric layer 140. The lower conductive vias 3182 may connect the peripheral annular region 1134A to an annular conductive trace 3184 formed on the dielectric layer 140, and the core region 3134B to a core conductive pad 3186 formed within the annular conductive trace 3184 on the dielectric layer 140. Bonding pads 3192, 3194 may be formed on the annular conductive trace 3184 and the conductive pad 3186, respectively, having a shape corresponding to the underlying annular conductive trace 3184 or conductive pad 3186. For example, the bonding pad 3192 may have an annular shape substantially matching the shape of the annular conductive trace 3184, and the bonding pad 3194 may have a substantially circular shape matching the shape of the conductive pad 3186. It should be noted that the circular shape of the bonding pad 3194 and the conductive pad 3186 is not limited to a perfect circle, and elongated shapes (e.g., ellipses) are also contemplated within the disclosure. Furthermore, the concentric shape need not be circular or elliptical, but may be, for example, rectangular or any other polygonal shape. For example, the annular conductive trace 3184 may form a rectangular frame, and the conductive pad 3186 may be a square or rectangular pad disposed into the rectangular frame. In some embodiments, the bonding pads 456, 458 have matching shapes and sizes with the bonding pads 3192, 3194 to which they are respectively bonded. For example, the bonding pad 456 may have an annular shape matching the annular shape of the bonding pad 3192, and the bonding pad 458 may have a circular shape matching the shape of the bonding pad 3194. As illustrated in FIG. 10C by the dash-dotted lines representing the edge 3186e of the conductive pad 3186, and the inner 3184i and outer 3184o edges of the annular conductive trace 3184, the bonding pads 456 may have substantially the same size as the bonding pads 3192, and the bonding pads 458 may have substantially the same size as the bonding pads 3194, while the underlying annular conductive trace 3184 and the conductive pad 3186 may be slightly smaller than the overlying bonding pads 3192, 3194.

In some embodiments, by adopting a connection scheme including concentric bonding pads 456, 458, 3192, 3194, it is possible to shorten the routing between the semiconductor die 450 and the optical devices 3134.

In some embodiments, features of the semiconductor devices SD10-SD40 may be combined as required. For example, the concentric connection scheme illustrated in FIG. 10A to FIG. 10C may be applied in the semiconductor device SD30 of FIG. 7 between the semiconductor die 300 and the optical device 134. As another example, the semiconductor device SD20 of FIG. 5 may include multiple semiconductor dies as illustrated for the semiconductor device SD30 of FIG. 7, and the semiconductor dies may be directly interconnected by patterned conductive traces 1180 of the interconnection structure 1170, as illustrated for the patterned conductive traces 2180 of the interconnection structure 2170.

In accordance with some embodiments of the disclosure, a semiconductor device includes a light emitting die and a semiconductor package. The light emitting die includes a substrate and a first conductive pad. The substrate has an emission region located at a side surface of the substrate. The first conductive pad is located at a bottom surface of the substrate. The semiconductor package includes a semiconductor-on-insulator substrate, an interconnection structure, a second conductive pad, and a through semiconductor via. The semiconductor-on-insulator substrate has a linear waveguide formed therein. The interconnection structure is disposed on the semiconductor-on-insulator substrate. An edge coupler is embedded within the interconnection structure and is connected to the linear waveguide. The semiconductor-on-insulator substrate and the interconnection structure include a recess in which the light-emitting die is disposed. The edge coupler is located in the interconnection structure close to a sidewall of the recess. The second conductive pad is located at the bottom of the recess. The through semiconductor via extends across the semiconductor-on-insulator substrate to contact the second conductive pad. The first conductive pad is connected to the through semiconductor via through the second conductive pad. The emission region directly faces the sidewall of the recess where the edge coupler is located, so that light emitted by the light-emitting die is received by the edge coupler.

In accordance with some embodiments of the disclosure, a semiconductor device includes a bulk semiconductor layer, an insulator layer, an optical device, an interconnection structure, and a semiconductor die. The insulator layer is disposed on the bulk semiconductor layer. The optical device is disposed on the insulator layer. The optical device includes a core region and an annular peripheral region. The annular peripheral region at least partially encircles the core region. The interconnection structure is disposed over the bulk semiconductor layer and covers the optical device. The interconnection structure includes a first annular bonding pad, a first core bonding pad, and a first dielectric layer. The first annular bonding pad is connected to the annular peripheral region of the optical device. The first core bonding pad is connected to the core region of the optical device. The first annular bonding pad and the first core bonding pad are entrenched in the first dielectric layer. The semiconductor die is bonded to the interconnection structure. The semiconductor die includes a second dielectric layer, a second annular bonding pad, and a second core bonding pad. The second dielectric layer is formed at a front surface of the semiconductor die. The second annular bonding pad is entrenched in the second dielectric layer. The second core bonding pad is encircled by the second annular bonding pad and is entrenched in the second dielectric layer. The second annular bonding pad has matching shape and size with the first annular bonding pads and is directly bonded to the first annular bonding pad. The second core bonding pad has matching shape and size with the first core bonding pad and is directly bonded to the first core bonding pad.

In accordance with some embodiments of the disclosure, a manufacturing method of a semiconductor device includes the following steps. A front semiconductor layer of a semiconductor-on-insulator substrate is patterned to form a waveguide pattern. An interconnection structure is formed on the semiconductor-on-insulator substrate. The interconnection structure has an edge coupler embedded therein. The edge coupler is connected to the waveguide pattern. The semiconductor-on-insulator substrate and the interconnection structure are patterned to form a recess exposing at its bottom a bulk semiconductor layer of the semiconductor-on-insulator substrate. A through semiconductor via is formed. The through semiconductor via extends through the bulk semiconductor layer of the semiconductor-on-insulator substrate at the bottom of the recess. A conductive pad is formed at the bottom of the recess on one end of the first through semiconductor via. A light-emitting die is disposed in the recess so that an emission region of the light-emitting die is aligned with the edge coupler. The light-emitting die is flip-chip bonded to the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a light-emitting die, comprising:
      a substrate, having an emission region located at a side surface of the substrate; and
      a first conductive pad located at a bottom surface of the substrate; and
   a semiconductor package, comprising:
      a semiconductor-on-insulator substrate having a linear waveguide formed therein;
      an interconnection structure disposed on the semiconductor-on-insulator substrate, wherein an edge coupler is embedded within the interconnection structure and is connected to the linear waveguide, the semiconductor-on-insulator substrate and the interconnection structure include a recess in which the light-emitting die is disposed, and the edge coupler is located in the interconnection structure close to a sidewall of the recess;
      a second conductive pad located at a bottom of the recess; and
      a through semiconductor via extending across the semiconductor-on-insulator substrate to contact the second conductive pad,
      wherein the first conductive pad is connected to the through semiconductor via through the second conductive pad, and wherein the emission region directly faces the sidewall of the recess where the edge coupler is located, whereby light emitted by the light-emitting die is received by the edge coupler.

2. The semiconductor device of claim 1, further comprising:
a circuit substrate, and
conductive terminals located at an opposite side of the semiconductor-on-insulator substrate with respect to the interconnection structure, wherein the conductive terminals connect the semiconductor package to the circuit substrate,
wherein the light-emitting die is connected to the circuit substrate by the through semiconductor via and by at least one conductive terminal of the conductive terminals.

3. The semiconductor device of claim 1, wherein the semiconductor package further comprises:
a semiconductor die connected to the interconnection structure; and
another through semiconductor via extending across the semiconductor-on-insulator substrate to be connected to the semiconductor die via the interconnection structure,
wherein, along a stacking direction of the semiconductor-on-insulator substrate and the semiconductor die, the other through semiconductor via is longer than the through semiconductor via connected to the light-emitting die.

4. The semiconductor device of claim 3, wherein the interconnection structure comprises a first dielectric layer and first bonding pads,
the semiconductor die comprises a second dielectric layer and second bonding pads,
the first bonding pads are directly bonded to the second bonding pads, and the first dielectric layer is directly bonded to a portion of the second dielectric layer.

5. The semiconductor device of claim 4, wherein the first bonding pads include a core bonding pad encircled by an annular bonding pad.

6. The semiconductor device of claim 3, further comprising solder balls connecting the semiconductor die to the interconnection structure; and
an underfill disposed between the semiconductor die and the interconnection structure and surrounding the solder balls.

7. The semiconductor device of claim 1, wherein the light-emitting die further comprises a supporting pillar, connected at one end to the bottom surface of the substrate of the light-emitting die beside the conductive pad and having an alignment recess formed at an opposite end,
wherein an alignment pedestal is located at the bottom of the recess, beside the second conductive pad, and
the alignment pedestal is received in the alignment recess.

8. The semiconductor device of claim 7, wherein the alignment pedestal includes same materials as the semiconductor-on-insulator substrate and is integrally formed with the semiconductor-on-insulator substrate.

9. The semiconductor device of claim 7, wherein the supporting pillar is integrally formed with the substrate of the light-emitting die.

10. A semiconductor device, comprising:
a bulk semiconductor layer;
an insulator layer disposed on the bulk semiconductor layer;
an optical device disposed on the insulator layer, the optical device comprising a core region and an annular peripheral region at least partially encircling the core region;
an interconnection structure disposed over the bulk semiconductor layer and covering the optical device, wherein the interconnection structure comprises:
a first annular bonding pad connected to the annular peripheral region of the optical device;
a first core bonding pad connected to the core region of the optical device; and
a first dielectric layer, in which the first annular bonding pad and the first core bonding pad are entrenched; and
a semiconductor die, bonded to the interconnection structure, the semiconductor die comprising:
a second dielectric layer formed at a front surface of the semiconductor die;
a second annular bonding pad entrenched in the second dielectric layer; and
a second core bonding pad encircled by the second annular bonding pad and entrenched in the second dielectric layer;
wherein the second annular bonding pad has matching shape and size with the first annular bonding pad and is directly bonded to the first annular bonding pad and
the second core bonding pad has matching shape and size with the first core bonding pad and is directly bonded to the first core bonding pad.

11. The semiconductor device of claim 10, wherein the interconnection structure further comprises first patterned conductive traces connecting the annular peripheral region of the optical device to the first annular bonding pad, and second patterned conductive traces connecting the core region of the optical device to the core bonding pad.

12. The semiconductor device of claim 11, wherein the first patterned conductive traces include an annular conductive trace disposed in contact with the first annular bonding pad, and conductive vias vertically extending to contact the annular peripheral region of the optical device at one end and the annular conductive trace at an opposite end.

13. The semiconductor device of claim 10, wherein the annular peripheral region includes a semiconductor material of opposite conductivity with respect to a semiconductor material included in the core region.

14. The semiconductor device of claim 10, further comprising:
an edge coupler embedded in a region of the interconnection structure, and
a light-emitting die disposed in a recess of the interconnection structure, wherein an emission region of the light-emitting die directly faces the region of the interconnection structure in which the edge coupler is embedded.

15. The semiconductor device of claim 10, further comprising another semiconductor die disposed beside the semiconductor die, wherein the other semiconductor die is also bonded to the interconnection structure and at least one patterned conductive trace of the interconnection structure connects the semiconductor die to the other semiconductor die.

16. A semiconductor device, comprising:
a light-emitting die, comprising:
a substrate, having an emission region located at a side surface of the substrate; and
a first conductive pad located at a bottom surface of the substrate; and a semiconductor package, comprising:
> a semiconductor-on-insulator substrate having a linear waveguide formed therein;
> an interconnection structure disposed on the semiconductor-on-insulator substrate, wherein an edge coupler is embedded within the interconnection structure and is connected to the linear waveguide, the semiconductor-on-insulator substrate and the interconnection structure include a recess in which the light-emitting die is disposed, the recess penetrates through the interconnection structure and partially into the semiconductor-on-insulator substrate, and the edge coupler is located in the interconnection structure close to a sidewall of the recess;
> a second conductive pad located at a bottom of the recess.

17. The semiconductor device of claim 16, further comprising a through semiconductor via extending across the semiconductor-on-insulator substrate to contact the second conductive pad.

18. The semiconductor device of claim 17,
> wherein the first conductive pad is connected to the through semiconductor via through the second conductive pad, and
> wherein the emission region directly faces the sidewall of the recess where the edge coupler is located, whereby light emitted by the light-emitting die is received by the edge coupler.

19. The semiconductor device of claim 17, further comprising:
> a circuit substrate, and
> conductive terminals located at an opposite side of the semiconductor-on-insulator substrate with respect to the interconnection structure, wherein the conductive terminals connect the semiconductor package to the circuit substrate,
> wherein the light-emitting die is connected to the circuit substrate by the through semiconductor via and by at least one conductive terminal of the conductive terminals.

20. The semiconductor device of claim 17, wherein the semiconductor package further comprises:
> a semiconductor die connected to the interconnection structure; and
> another through semiconductor via extending across the semiconductor-on-insulator substrate to be connected to the semiconductor die via the interconnection structure,
> wherein, along a stacking direction of the semiconductor-on-insulator substrate and the semiconductor die, the other through semiconductor via is longer than the through semiconductor via connected to the light-emitting die.

\* \* \* \* \*